United States Patent
Lei et al.

(10) Patent No.: US 10,341,042 B2
(45) Date of Patent: Jul. 2, 2019

(54) NARROWBAND OPERATION WITH REDUCED SAMPLING RATE

(71) Applicant: QUALCOMM Incorporated, San Diego, CA (US)

(72) Inventors: Jing Lei, San Diego, CA (US); Hao Xu, San Diego, CA (US); Yongbin Wei, La Jolla, CA (US); Durga Prasad Malladi, San Diego, CA (US); Peter Gaal, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 73 days.

(21) Appl. No.: 15/212,595

(22) Filed: Jul. 18, 2016

(65) Prior Publication Data

US 2017/0033887 A1 Feb. 2, 2017

Related U.S. Application Data

(60) Provisional application No. 62/197,563, filed on Jul. 27, 2015.

(51) Int. Cl.
*H04L 27/26* (2006.01)
*H04W 4/70* (2018.01)
(Continued)

(52) U.S. Cl.
CPC ......... *H04L 1/0002* (2013.01); *H03H 17/065* (2013.01); *H04L 1/0018* (2013.01);
(Continued)

(58) Field of Classification Search
CPC .... H04W 4/005; H04W 4/70; H04L 27/2607; H04L 27/2628; H04L 27/265;
(Continued)

(56) References Cited

U.S. PATENT DOCUMENTS

2004/0081123 A1* 4/2004 Krishnan ............ H04L 1/0004
370/329
2006/0039273 A1* 2/2006 Gore ................... H04L 5/0044
370/208
(Continued)

FOREIGN PATENT DOCUMENTS

EP         2151945 A2     2/2010
WO    WO-2009117874 A1   10/2009

OTHER PUBLICATIONS

Chu et al. "Design of an OFDMA Baseband Receiver for 3GPP Long-Term Evolution," IEEE International Symposium on VLSI Design, Automation and Test, Apr. 23, 2008, pp. 196-199.*
(Continued)

*Primary Examiner* — Un C Cho
*Assistant Examiner* — Lalita W Pace
(74) *Attorney, Agent, or Firm* — Holland & Hart LLP

(57) ABSTRACT

Methods, systems, and devices for wireless communication are described. A wireless device may use a sampling rate that is less than a default sampling rate associated with a wireless carrier. The device may operate in a narrowband portion of a system bandwidth, and the sampling rate may be less than that used by devices monitoring the whole bandwidth. Multiple sampling rates may be used so that a portion of signal processing may be associated with one sampling rate and another portion of the signal processing may be associated with another sampling rate. The size of a cyclic prefix (CP) may be adjusted based on the sampling rate to align subframe timing boundaries for signals of different sampling rates. In some cases, each symbol of a signal may include both a CP and a postfix such that the postfix for each symbol overlaps the prefix of the next symbol.

31 Claims, 15 Drawing Sheets

(51) Int. Cl.
*H04L 1/00* (2006.01)
*H03H 17/06* (2006.01)

(52) U.S. Cl.
CPC ........ *H04L 27/2602* (2013.01); *H04L 27/265* (2013.01); *H04L 27/2607* (2013.01); *H04L 27/2628* (2013.01); *H04W 4/70* (2018.02)

(58) Field of Classification Search
CPC . H04L 27/2602; H04L 1/0002; H04L 43/028; H04L 1/0018; H03H 17/065
See application file for complete search history.

(56) References Cited

U.S. PATENT DOCUMENTS

| | | | | |
|---|---|---|---|---|
| 2008/0039133 | A1* | 2/2008 | Ma | H04L 27/2626 455/552.1 |
| 2008/0043866 | A1* | 2/2008 | Mujtaba | H04L 27/2628 375/260 |
| 2008/0151984 | A1* | 6/2008 | Schmidt | H03H 17/0642 375/230 |
| 2010/0002571 | A1* | 1/2010 | Liao | H04L 27/2647 370/208 |
| 2010/0034311 | A1* | 2/2010 | Hasegawa | H04L 5/0007 375/267 |
| 2015/0036651 | A1* | 2/2015 | Takeda | H04W 4/005 370/330 |
| 2015/0146612 | A1* | 5/2015 | Shor | H04B 1/0057 370/328 |
| 2015/0372843 | A1* | 12/2015 | Bala | H04L 25/03834 375/295 |

OTHER PUBLICATIONS

Chu et al. "Design of an OFDMA Baseband Receiver for 3GPP Long-Term Evolution," IEEE International Symposium on VLSI Design, Automation and Test, Apr. 23, 2008, pp. 196-199 (Year: 2008).*

Chu et al., "Design of an OFDMA Baseband Receiver for 3GPP Long-Term Evolution", IEEE International Symposium on VLSI Design, Automation and Test, Apr. 23, 2008, pp. 196-199, XP031272469, ISBN: 978-1-4244-1617-2/08, Institute of Electrical and Electronics Engineers.

Huawei et al., "Remaining Details of Uplink Frame Structure Design", 3GPP TSG RAN WG1 Meeting #84, R1-160329, St. Julian's, Malta, Feb. 15-19, 2016, 8 pgs., XP051064146, 3rd Generation Partnership Project.

Intel Corporation, "NB-IoT Primary Synchronization Signal Design", 3GPP TSG RAN WG1 NB-IoT Ad-Hoc Meeting, R1-160187, Budapest, Hungary, Jan. 18-20, 2016, 14 pgs., XP051053512, 3rd Generation Partnership Project.

Intel Corporation, "On Device Complexity for NB-IoT", 3GPP TSG RAN WG1 Meeting #83, R1-156524, Anaheim, USA, Nov. 16-20, 2015, 10 pgs., XP051042062, 3rd Generation Partnership Project.

ISA/EP, International Search Report and Written Opinion of the International Searching Authority, Int'l Application No. PCT/US2016/042890, dated Nov. 15, 2016, European Patent Office, Rijswijk, NL, 16 pgs.

* cited by examiner

NARROWBAND OPERATION WITH REDUCED SAMPLING RATE

CROSS REFERENCES

The present application for patent claims priority to U.S. Provisional Patent Application No. 62/197,563 by LEI, et al., entitled "NARROWBAND OPERATION WITH REDUCED SAMPLING RATE," filed Jul. 27, 2015, assigned to the assignee hereof.

BACKGROUND

The following relates generally to wireless communication, and more specifically to narrowband operation with reduced sampling rate.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system). A wireless multiple-access communications system may include a number of base stations, each simultaneously supporting communication for multiple communication devices, which may be otherwise known as user equipment (UE).

Some wireless communications systems may provide for narrowband communication between wireless devices, such as those implementing machine-to-machine (M2M) communication or machine type communication (MTC). In some examples, MTC devices may have reduced complexity or reduced performance metrics and may be associated with narrowband communication, low cost operation, low power consumption, or the like. Signal processing using sampling rates appropriate for non-MTC devices may result in high processing complexity and power consumption relative to the capabilities of an MTC device.

SUMMARY

A wireless device, such as a machine type communication (MTC) device, may use a sampling rate that is less than a default sampling rate associated with a wireless carrier. For example, the device may operate in a narrowband portion of a carrier bandwidth, and the sampling rate may be less than that used by devices monitoring the whole bandwidth. In some cases, signal processing may use multiple sampling rates so that a portion of the signal processing may be associated with one sampling rate and another portion of the signal processing may be associated with another sampling rate. In some examples, the size of a cyclic prefix (CP) may be adjusted based at least in part on the sampling rate to align the low sampling rate subframe timing with that of the default sampling rate. In some cases, each symbol of a signal may include both a CP and a postfix such that the postfix for each symbol overlaps the prefix of the next symbol.

A method of wireless communication is described. The method may include generating a sequence based at least in part on a first sampling rate that is less than a second sampling rate associated with the system bandwidth, generating a first cyclic prefix, wherein the first cyclic prefix is associated with the first sampling rate, and transmitting a signal comprising the sequence and the first cyclic prefix in the narrowband region.

An apparatus for wireless communication is described. The apparatus may include means for generating a sequence based at least in part on a first sampling rate that is less than a second sampling rate associated with the system bandwidth, means for generating a first cyclic prefix, wherein the first cyclic prefix is associated with the first sampling rate, and means for transmitting a signal comprising the sequence and the first cyclic prefix in the narrowband region.

A further apparatus for wireless communication is described. The apparatus may include a processor, memory in electronic communication with the processor, and instructions stored in the memory, the instructions being executable by the processor to cause the apparatus to generate a sequence based at least in part on a first sampling rate that is less than a second sampling rate associated with the system bandwidth, generate a first cyclic prefix, wherein the first cyclic prefix is associated with the first sampling rate, and transmit a signal comprising the sequence and the first cyclic prefix in the narrowband region.

A non-transitory computer-readable medium storing code for wireless communication is described. The code may include instructions executable to generate a sequence based at least in part on a first sampling rate that is less than a second sampling rate associated with the system bandwidth, generate a first cyclic prefix, wherein the first cyclic prefix is associated with the first sampling rate, and transmit a signal comprising the sequence and the first cyclic prefix in the narrowband region.

Some examples of the methods, apparatuses, or non-transitory computer-readable medium described herein may further include processes, features, means, or instructions for generating a second cyclic prefix and a third cyclic prefix associated with the first sampling rate, wherein the first cyclic prefix has a first duration, and wherein the second and third cyclic prefixes have a second duration that is shorter than the first duration, wherein the signal comprises a first symbol period with the first cyclic prefix, a second symbol period with the second cyclic prefix, and a third symbol period with the third cyclic prefix. Additionally or alternatively, in some examples the first symbol period aligns with a symbol period associated with the system bandwidth, and wherein a first pair comprising the second and third symbol periods aligns with a second pair of symbol periods associated with the system bandwidth.

Some examples of the methods, apparatuses, or non-transitory computer-readable medium described herein may further include processes, features, means, or instructions for converting symbols associated with the first sampling rate to a third sampling rate that is greater than the first sampling rate and less than the second sampling rate. Additionally or alternatively, some examples may include processes, features, means, or instructions for generating filler samples at the third sampling rate, wherein the signal comprises symbols having at least one filler sample.

Some examples of the methods, apparatuses, or non-transitory computer-readable medium described herein may further include processes, features, means, or instructions for symbol periods associated with the narrowband region align with symbol periods associated with the system bandwidth. Additionally or alternatively, in some examples generating the sequence comprises performing an inverse fast Fourier transform based at least in part on the first sampling rate.

In some examples of the methods, apparatuses, or non-transitory computer-readable medium described herein, generating the sequence comprises performing a digital-to-analog conversion based at least in part on the first sampling rate. Additionally or alternatively, some examples may include processes, features, means, or instructions for applying a low latency transmission filter based at least in part on a spectral mask.

Some examples of the methods, apparatuses, or non-transitory computer-readable medium described herein may further include processes, features, means, or instructions for appending a postfix to the sequence, wherein the signal comprises a first symbol window and a second symbol window, the first symbol window comprising the sequence, the first cyclic prefix, and the postfix, wherein the postfix of the first symbol window overlaps a second cyclic prefix of the second symbol window. Additionally or alternatively, in some examples the signal comprises symbol periods of a timing configuration associated with the narrowband region, and wherein subframes of the timing configuration associated with the narrowband region align with subframes of a timing configuration associated with the system bandwidth.

A further method of wireless communication is described. The method may include receiving a signal in the narrowband region, the signal based at least in part on a first sampling rate that is less than a second sampling rate associated with the system bandwidth, identifying a first set of samples of the signal at the first sampling rate, wherein at least one sample of the first set of samples corresponds to a first cyclic prefix associated with the first sampling rate, and extracting information from a subset of the first set of samples, wherein the subset excludes the at least one sample that corresponds to the first cyclic prefix.

A further apparatus for wireless communication is described. The apparatus may include means for receiving a signal in the narrowband region, the signal based at least in part on a first sampling rate that is less than a second sampling rate associated with the system bandwidth, means for identifying a first set of samples of the signal at the first sampling rate, wherein at least one sample of the first set of samples corresponds to a first cyclic prefix associated with the first sampling rate, and means for extracting information from a subset of the first set of samples, wherein the subset excludes the at least one sample that corresponds to the first cyclic prefix.

A further apparatus for wireless communication is described. The apparatus may include a processor, memory in electronic communication with the processor, and instructions stored in the memory, the instructions being executable by the processor to cause the apparatus to receive a signal in the narrowband region, the signal based at least in part on a first sampling rate that is less than a second sampling rate associated with the system bandwidth, identify a first set of samples of the signal at the first sampling rate, wherein at least one sample of the first set of samples corresponds to a first cyclic prefix associated with the first sampling rate, and extract information from a subset of the first set of samples, wherein the subset excludes the at least one sample that corresponds to the first cyclic prefix.

A further non-transitory computer-readable medium storing code for wireless communication is described. The code may include instructions executable to receive a signal in the narrowband region, the signal based at least in part on a first sampling rate that is less than a second sampling rate associated with the system bandwidth, identify a first set of samples of the signal at the first sampling rate, wherein at least one sample of the first set of samples corresponds to a first cyclic prefix associated with the first sampling rate, and extract information from a subset of the first set of samples, wherein the subset excludes the at least one sample that corresponds to the first cyclic prefix.

Some examples of the methods, apparatuses, or non-transitory computer-readable medium described herein may further include processes, features, means, or instructions for identifying a second set of samples of the signal at the first sampling rate, wherein at least one sample of the second set of samples corresponds to a second cyclic prefix associated with the first sampling rate, and identifying a third set of samples of the signal at the first sampling rate, wherein at least one sample of the third set of samples corresponds to the first cyclic prefix, wherein the first set of samples corresponds to a first symbol period of a subframe, the second set of samples corresponds to a second symbol period of the subframe following the first symbol period, and the third set of samples corresponds to a third symbol period of the subframe following the second symbol period. Additionally or alternatively, in some examples a first pair comprising the second and third symbol periods aligns with a second pair of symbol periods associated with the system bandwidth.

Some examples of the methods, apparatuses, or non-transitory computer-readable medium described herein may further include processes, features, means, or instructions for processing the subset of the first set of samples at a third sampling rate that is less than the first sampling rate. Additionally or alternatively, in some examples the first set of samples comprises a filler sample associated with the third sampling rate, and the subset of the first set of samples excludes the filler sample.

Some examples of the methods, apparatuses, or non-transitory computer-readable medium described herein may further include processes, features, means, or instructions for symbol period associated with the narrowband region align with symbol periods associated with the system bandwidth. Additionally or alternatively, in some examples the first set of samples corresponds to a symbol period of a timing configuration associated with the narrowband region, and wherein subframes of the timing configuration associated with the narrowband region align with subframes of a timing configuration associated with the system bandwidth.

BRIEF DESCRIPTION OF THE DRAWINGS

Aspects of the disclosure are described in reference to the following figures.

DETAILED DESCRIPTION

Figure 1:
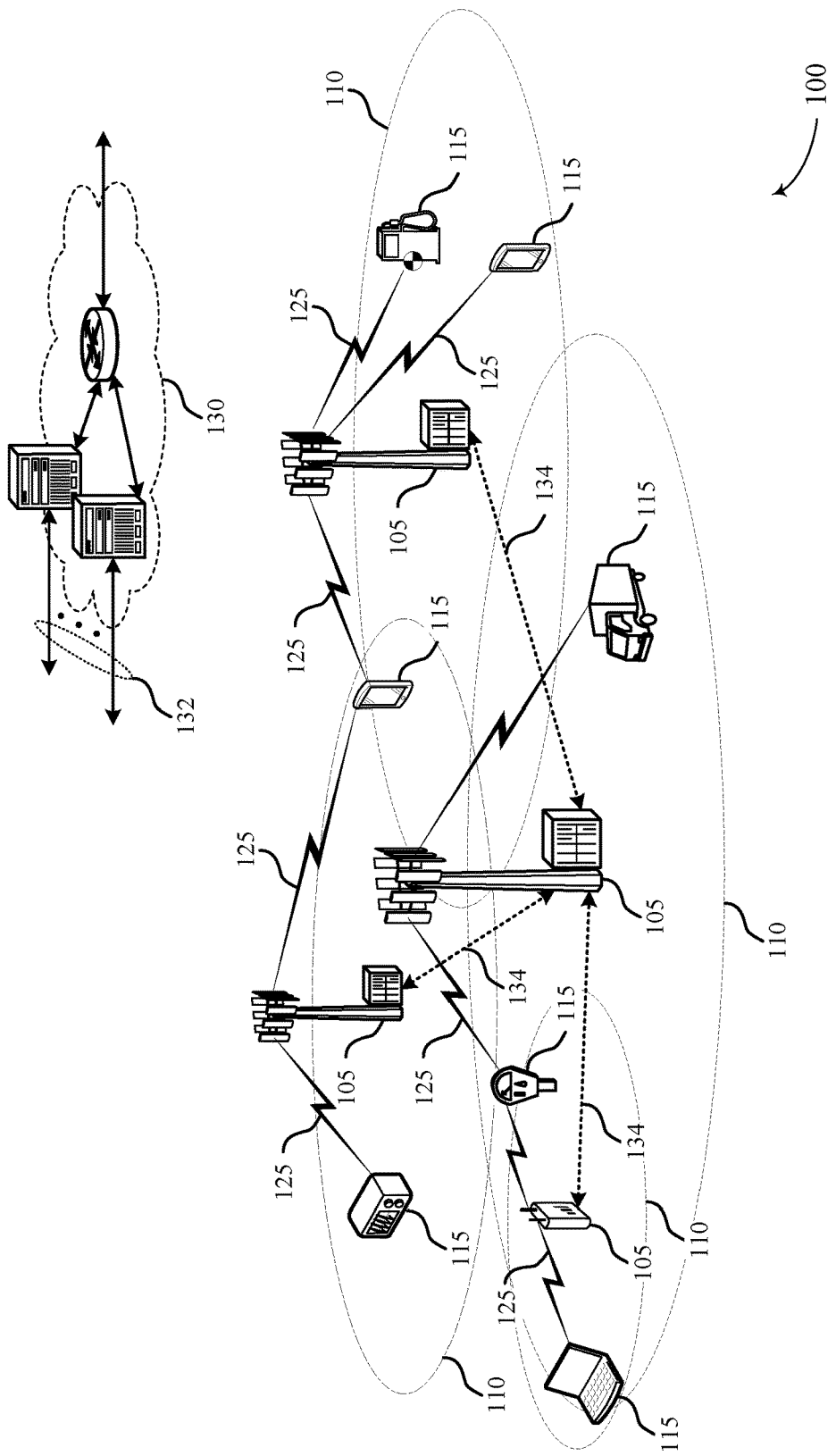
FIG. 1 illustrates an example of a wireless communications system that supports narrowband operation with reduced sampling rate in accordance with various aspects of the present disclosure.

Some wireless communication systems may support machine-to-machine (M2M) communication or machine type communication (MTC), which may use a relatively narrow portion of a system's overall bandwidth. MTC devices may benefit from wireless signals that are generated at, and thus able to be processed at, a reduced sampling rate, which may allow the device to realize reduced processing complexity and power consumption as compared to signal processing at higher sampling rates. When operating with a reduced sampling rate, the size of a cyclic prefix (CP) appended to each symbol may be adjusted to preserve timing alignment with devices using a higher sampling rate, for example.

A sampling rate, as discussed herein, may be the rate at which an analog or continuous signal is converted to a discrete or digital signal. The term sampling rate may also refer to a clock rate for certain digital signal processing functions. A reduced sampling rate may be a sampling rate that is reduced relative to (e.g., is less than) other sampling rates within a system. That is, certain enhancements in some wireless systems may allow for MTC devices to communicate in a narrow bandwidth as low as one resource block (e.g., a 180 kHz band with 15 kHz tone spacing). Narrowband devices may use a sampling rate that is lower than the sampling rate associated with the system bandwidth (e.g., 1.92 Mbps sampling rate for a 1.4 MHz subchannel instead of 30.72 Mbps for a 20 MHz channel).

Using a reduced sampling rate may impact the waveforms generated by the signal generation process. Filters may thus be used to ensure that the resulting waveforms satisfy any appropriate spectral mask standards. Additionally, the reduced sampling rate may impact the system timing. A modified CP may be used to align the timing configuration for narrowband communication with the timing configuration for the system bandwidth. So, for example, when a sampling rate is reduced, the CP duration for narrowband communications may also be different from the system bandwidth.

A CP may be generally used to reduce inter-symbol interference. In some cases, symbol boundaries and the corresponding subframe boundaries may be based on a CP with a non-uniform length. As a result, a specific sequence of CPs may be used for coherent timing configurations for wireless communication. In some cases, a sampling rate used for signal processing may be based on the boundaries between subcarriers in the communication frequency band and may be related to the CP length.

Aspects of the disclosure introduced above are further described below in the context of an example wireless communication system. Specific examples are then described for modified processing stages and timing configuration alignment in narrowband communication. These and other aspects of the disclosure are further illustrated by and described with reference to apparatus diagrams, system diagrams, and flowcharts that relate to narrowband operation with reduced sampling rate.

FIG. 1 illustrates an example of a wireless communications system 100 that supports narrowband operation with reduced sampling rate in accordance with various aspects of the present disclosure. The wireless communications system 100 includes base stations 105, user equipment (UEs) 115, and a core network 130. In some examples, the wireless communications system 100 may be a Long Term Evolution (LTE)/LTE-Advanced (LTE-A) network. Wireless communications system 100 may support reduced sampling rates for narrowband devices (e.g., for MTC devices), and may use modified CPs to attain timing alignment between devices using a reduced sampling rate and devices using a sampling rate associated with the system bandwidth.

Base stations 105 may wirelessly communicate with UEs 115 via one or more base station antennas. Each base station 105 may provide communication coverage for a respective geographic coverage area 110. Communication links 125 shown in wireless communications system 100 may include uplink (UL) transmissions from a UE 115 to a base station 105, or downlink (DL) transmissions, from a base station 105 to a UE 115. UEs 115 may be dispersed throughout the wireless communications system 100, and each UE 115 may be stationary or mobile. A UE 115 may also be referred to as a mobile station, a subscriber station, a remote unit, a wireless device, an access terminal, a handset, a user agent, a client, or some other suitable terminology. A UE 115 may also be a cellular phone, a wireless modem, a handheld device, a personal computer, a tablet, a personal electronic device, an MTC device or the like.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as eNodeBs (eNBs) 105.

Some types of wireless devices may provide for automated communication. Automated wireless devices may include those implementing M2M communication or MTC, which may allow devices to communicate with one another or a base station without human intervention. For example, MTC devices may refer to devices with integrated sensors or meters to measure or capture information and relay that information to a central server or application program that can make use of the information or present the information to humans interacting with the program or application. Some UEs 115 may be MTC devices, such as those designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

An MTC device may operate using half-duplex (one-way) communications at a reduced peak rate, for example. MTC devices may also be configured to enter a power saving "deep sleep" mode when not engaging in active communications. During a deep sleep mode, an MTC device may power down some of its componentry and refrain from transmitting or receiving for relatively long periods of time (e.g., tens of seconds, minutes, hours, etc.). In order to leverage additional power saving or communicate effectively using their relatively low complexity (e.g., half-duplex capability, narrowband configuration, etc.) wireless communications system 100 may utilize reducing sampling rates for narrowband communications with MTC devices with the wireless communications system 100.

LTE systems may utilize OFDMA on the DL and SC-FDMA on the UL. OFDMA and SC-FDMA partition the system bandwidth into multiple (K) orthogonal subcarriers, which are also commonly referred to as tones or bins. Each subcarrier may be modulated with data. The spacing between adjacent subcarriers may be fixed, and the total number of subcarriers (K) may be dependent on the system bandwidth. For example, K may be equal to 72, 180, 300, 600, 900, or 1200 with a subcarrier spacing of 15 kilohertz (KHz) for a corresponding system bandwidth (with guardband) of 1.4, 3, 5, 10, 15, or 20 megahertz (MHz), respectively. The system bandwidth may also be partitioned into sub-bands. For example, a sub-band may cover 1.08 MHz, and there may be 1, 2, 4, 8 or 16 sub-bands. In some cases, MTC devices may monitor a portion of the overall system bandwidth (e.g., a subband or a portion of a subband).

A frame structure may be used to organize physical resources within a carrier. A frame may be a 10 ms interval that may be further divided into 10 equally sized sub-frames. In some cases the subframe may be the smallest scheduling unit, also known as a transmission time interval (TTI). In other cases, a TTI may be shorter than a subframe or may be dynamically selected (e.g., in short TTI bursts or in selected component carriers using short TTIs). MTC devices, including those in wireless communications system 100, may communicate using such frame structure.

Each sub-frame may include two consecutive time slots. Each slot may include 6 or 7 OFDMA symbol periods (depending on the length of a CP appended to each symbol). A resource element comprises one symbol period and one subcarrier (a 15 KHz frequency range). A resource block may contain 12 consecutive subcarriers in the frequency domain and, for a normal CP in each OFDM symbol, 7 consecutive OFDM symbols in the time domain (1 slot), or 84 resource elements. Some resource elements may include DL reference signals (DL-RS). The DL-RS may include a cell-specific reference signal (CRS) and a UE-specific reference signal (UE-RS). UE-RS may be transmitted on the resource blocks associated with physical downlink shared channel (PDSCH). The number of bits carried by each resource element may depend on the modulation scheme (the configuration of symbols that may be selected during each symbol period). Thus, the more resource blocks that a UE 115 receives and the higher the modulation scheme, the higher the data rate may be.

Time intervals in LTE may be expressed in multiples of a basic time unit (e.g., the sampling period, Ts=1/30,720,000 seconds. Excluding the CP, each symbol may contains 2048 sample periods. In some cases, MTC devices may process signals at a different sampling rate than that associated with devices utilizing the whole system bandwidth. For example, an MTC device may process signals using 16, 64, or 128 samples per symbol instead of 2048. This may reduce the processing complexity and conserve power.

Thus, a wireless device, such as a MTC device, may use a sampling rate that is less than a default sampling rate associated with a wireless carrier. In some cases, a portion of the signal processing done by an MTC device may be associated with one sampling rate and another portion of the signal processing may be associated with another sampling rate. The wireless communications system 100 may communicate with MTC devices using a CP with a size that may be adjusted based on the sampling rate to align the low or reduced sampling rate subframe timing with that of the default sampling rate, which may be used to communicate with other UEs 115 within wireless communications system 100. In some cases, each symbol may include both a CP and a postfix such that the postfix for each symbol overlaps the prefix of the next symbol.

Figure 2:
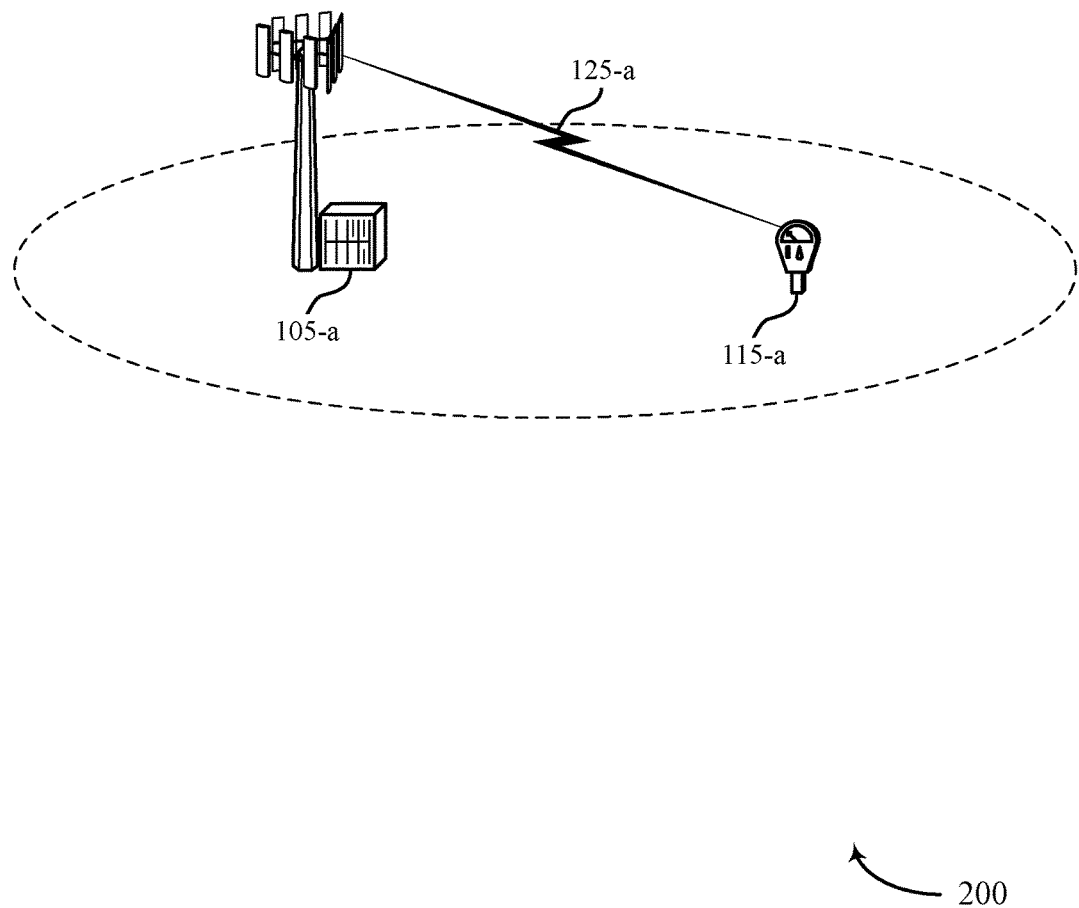
FIG. 2 illustrates an example of a wireless communications system that supports narrowband operation with reduced sampling rate in accordance with various aspects of the present disclosure.

FIG. 2 illustrates an example of a wireless communications system 200 that supports narrowband operation with reduced sampling rate in accordance with various aspects of the present disclosure. Wireless communications system 200 may include a UE 115-*a* and base station 105-*a*, which may be examples of a UE 115 base station 105 described with reference to FIG. 1. Wireless communications system 200 may support reduced sampling rates for narrowband devices (e.g., for UE 115-*a*, which may be an MTC device), and may use modified CPs to attain timing alignment between devices using a reduced sampling rate and devices using a sampling rate associated with the system bandwidth.

Wireless communications system 200 may thus support MTC or M2M communication, which may use a relatively narrow portion of the system's overall bandwidth. As mentioned above, MTC devices may be associated with reduced complexity and performance metrics, such as narrowband communication, low cost operation, low power consumption, or the like. An MTC device, such as UE 115-*a*, may thus benefit from wireless signals generated and able to be processed at a reduced sampling rate. This may allow for effective communication between base station 105-*a* and UE 115-*a*, which may have reduced processing complexity and power storage as compared with other UEs 115. When operating with a reduced sampling rate, the size of a CP appended to each symbol may be adjusted to preserve timing alignment with devices using a higher sampling rate.

For example, wireless communications system 200 may allow for MTC devices to communicate in a narrow bandwidth as low as one resource block (e.g., a 180 kHz band with 15 kHz tone spacing). Narrowband devices may use a sampling rate that is lower than the sampling rate associated with the system bandwidth (e.g., 1.92 Mbps sampling rate for a 1.4 MHz subchannel instead of 30.72 Mbps for a 20 MHz channel). As mentioned above, using a reduced sampling rate may impact the waveforms generated by the signal generation process. Filters may be used to ensure that the resulting waveforms satisfy any appropriate spectral mask standards. The reduced sampling rate may also impact the system timing. A modified CP may be used to align the timing configuration for narrowband communication with the timing configuration for the system bandwidth. That is, when a sampling rate is reduced, the CP duration for narrowband communications may also be different from the system bandwidth.

A CP may be a portion of a symbol repeated at the beginning of the symbol period to reduce inter-symbol interference. In some cases, symbol boundaries and the corresponding subframe boundaries may be based on a CP with a non-uniform length. As a result, a specific sequence of CPs may be used for coherent timing configurations for wireless communication. In some cases, a sampling rate used for signal processing may be based on the boundaries between subcarriers in the communication frequency band and may be related to the CP length.

In some wireless communication systems, sampling frequencies may take on certain values, e.g., 240, 480, 960, 1920 kHz, etc. Additionally, fast Fourier transform (FFT) and inverse fast Fourier transform (IFFT) sizes for conversions between frequency and time domains may depend on the sampling frequency. As shown in Table 1, an example of the relationships between a sampling frequency ($F_s$), FFT/IFFT size, and the symbol duration is provided.

TABLE 1

| $F_s$ (kHz) | FFT/IFFT Size | Symbol Duration (µs) |
|---|---|---|
| 240 | 16 | 16/0.24 ≈ 66.7 |
| 480 | 32 | 32/0.48 ≈ 66.7 |
| 960 | 64 | 64/0.96 ≈ 66.7 |
| 1920 | 128 | 128/1.92 ≈ 66.7 |

The duration of a CP in a system band may be longer for the first symbol of every slot (e.g. 5.2 µs) and shorter (e.g. 4.7 µs) for the remaining symbols. Table 2 provides examples of relationships between $F_s$, FFT/IFFT size, the number of samples for CP, and CP duration.

TABLE 2

| $F_s$ (kHz) | FFT/IFFT Size | Number of Samples for CP | CP Duration (µs) |
|---|---|---|---|
| 240 | 16 | 1 | 4.2 |
| 960 | 64 | {4, 5} | {4.2, 5.2} |
| 1920 | 128 | {9, 10} | {4.7, 5.2} |
| 30720 | 2048 | {144, 160} | {4.7, 5.2} |

Thus, an efficient, low complexity, deployment for narrowband communication may be accomplished by using a CP length that may be varied based on one or more sampling rates, which may be used to align the narrowband timing configuration with the timing configuration of the system bandwidth. By way of example, the CP length may be varied for narrowband communication. For instance, when using a sampling rate of 960 kHz, two different CP lengths may be interlaced in the narrow band and may correspond to two and three samples. Symbol groups may then be aligned to correspond to the system bandwidth.

In some examples, the alignment of symbols may be achieved using a CP based on a dual sampling rate. For instance, a primary processing rate (e.g., 240 kHz) may be used in both transmission and reception, and subsequent interpolation of a fractional CP and output sampling may use a different rate (e.g., 1.92 MHz). Additionally or alternatively, an extended symbol window may be used to accommodate a postfix as well as a prefix, such that adjacent symbols may overlap.

Figure 3A:
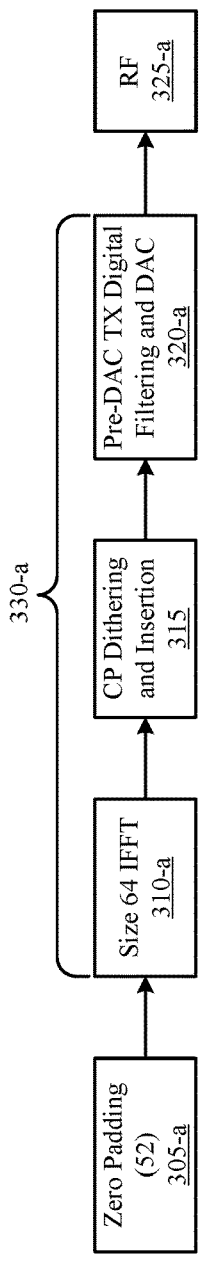
FIGS. 3A, 3B, and 3C illustrate examples of signal processing flows for systems that support narrowband operation with reduced sampling rate in accordance with various aspects of the present disclosure.
Figure 3B:
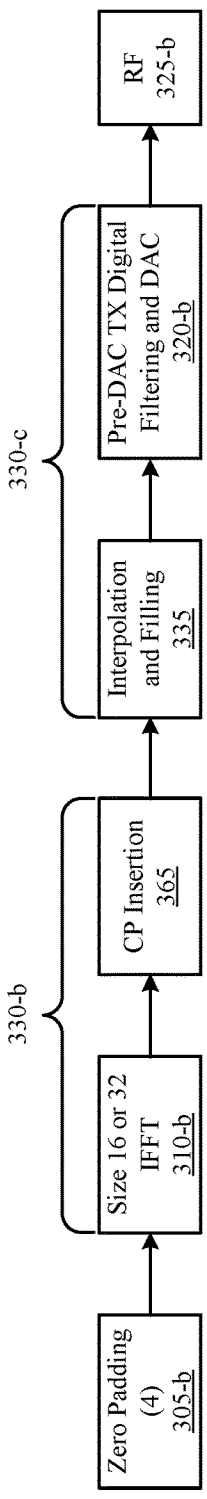
Figure 3C:
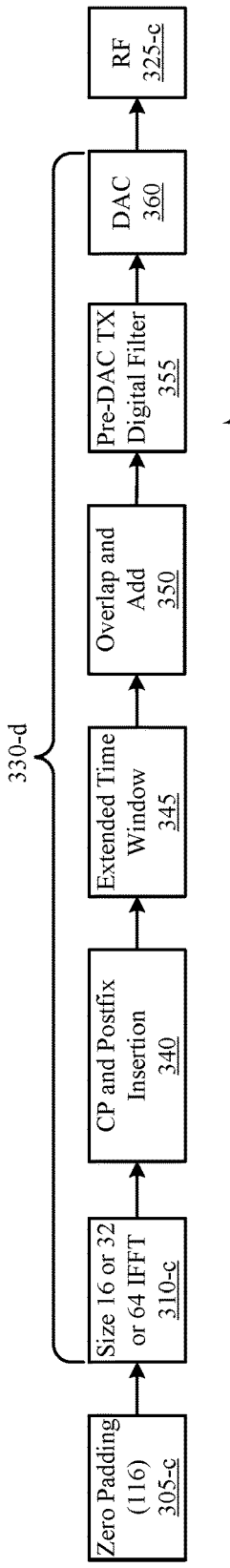

FIGS. 3A, 3B and 3C illustrate examples of signal processing flows 301, 302, and 303 for systems that support narrowband operation with reduced sampling rate in accordance with various aspects of the present disclosure. Signal processing flows 301, 302, and 303 may be used by a UE 115 and base station 105 described with reference to FIG. 1 or 2. Signal processing flows 301, 302, and 303 represent several examples of methods for using a reduced sampling and modifying a CP configuration to achieve timing alignment.

Signal processing flow 301 may, for example, represent signal processing at a reduced sampling rate (e.g., 960 kHz as compared with a system sampling rate of 30.72 MHz). Signal processing flow 301 may begin by adding 52 zeros to 12 data tones for each symbol at zero padding stage 305-a. A size 64 inverse fast Fourier transform (IFFT) may then be applied at IFFT stage 310-a to generate a time domain signal. At CP dithering and insertion stage 315, a CP generated at the 0.96 MHz sampling rate may be inserted at the beginning of each symbol. For example, the last five samples may be appended as CP for some symbols, such as symbols 1, 3 5, and 7 and the last four samples may be appended as CP for the remaining symbols, e.g., symbols 2, 4, and 6, as is illustrated in Table 3. At pre-digital-to-analog conversion (DAC) transmission digital filtering and DAC stage 320-a the device may apply transmission filtering and perform the DAC. At RF stage 325-a the narrowband waveform may be up-converted to radio frequency (RF) and transmitted. Thus signal processing flow 301 may represent an example in which a reduced sampling rate sub-process 330-a (e.g., at 960 kHz) may include the IFFT stage 310-a, the CP dithering and insertion stage 315, and pre-digital-to-analog DAC transmission digital filtering and DAC stage 320-a.

Based on the CP size associated with the sampling rate of signal processing flow 301, an alternating long and short CP for adjacent symbols may be used as demonstrated in Table 3, in which a constant number of data samples (D) follow each CP. That is, at 960 kHz, a 5 sample CP may have a duration of 5.2 µs (which may be the same as the 160 sample CP associated with the first symbol of each subframe at the system sampling rate). However, the 4 sample CP may have a duration of 4.2 µs (instead of the 4.7 µs CP associated with a 144 sample short CP for subsequent symbols at the system sampling rate). Thus, signal processing flow 301 may alternate between the long and short CP to ensure that each pair of symbols following the first symbol aligns with the system timing for non-MTC devices.

TABLE 3

| | Symbol Index | | | | | | | | | | | | | |
|---|---|---|---|---|---|---|---|---|---|---|---|---|---|---|
| | 1 | | 2 | | 3 | | 4 | | 5 | | 6 | | 7 | |
| Content | CP (l) | D | CP (s) | D | CP (l) | D | CP (s) | D | CP (l) | D | CP (s) | D | CP (l) | D |
| Sample Size | 5 | 64 | 4 | 64 | 5 | 64 | 4 | 64 | 5 | 64 | 4 | 64 | 5 | 64 |

On the receiver side, the narrowband waveform may be down-converted, and filtering and analog-to-digital conversion (ADC) may be performed at a sampling rate of 960 kHz. At symbols 1, 3, 5, and 7, the first five samples may be removed as a CP. Similarly, the first four samples may be removed as a CP in symbols 2, 4, and 6. Finally, a size 64 FFT may be used to generate the frequency domain waveform and extract the 12 data tones of each narrowband symbol.

In the example depicted in FIG. 3B, signal processing flow 302 includes dual sampling rates for signal processing (i.e., 240 kHz and 1.92 MHz). At zero padding stage 305-$b$, 12 data tones of each narrowband symbol may be padded with four zeros. At IFFT stage 310-$b$, a size 16 or size 32 IFFT, for example, may be used to generate time domain symbols. For each symbol, the last sample may be appended as a CP and inserted into each symbol at CP insertion stage 365. Thus, each symbol may include 17 samples. The 17 samples may then be converted into 136 (17.8) samples at 1.92 MHz. In some cases, however, these 136 samples may be insufficient to align the symbol periods with those associated with the system sampling rate. Thus, additional filler samples may be added at interpolation and filling stage 335 (at 1.92 MHz).

The interpolated samples may be filled into each symbol before the CP as illustrated in Tables 4A and 4B. For the first symbol, the last two samples of interpolated symbols may be used as filler samples (F). For the remaining symbols, a single sample may be added before the CP as further demonstrated in Table 4A and Table 4B. Thus, the single sample CP generated at 240 kHz with a duration of 4.2 µs may be augmented by 0.5 µs and 1 µs for the first symbol and subsequent symbols respectively such that the timing of each symbol aligns with that of the timing for symbols generated at the sampling rate associated with the system bandwidth.

TABLE 4A

| | Symbol Index | | | | | | | | | | | |
|---|---|---|---|---|---|---|---|---|---|---|---|---|
| | 1 | | | 2 | | | 3 | | | 4 | | |
| Content | F | CP | D | F | CP | D | F | CP | D | F | CP | D |
| Sample Size at 1.92 MHz | 2 | 8 | 128 | 1 | 8 | 128 | 1 | 8 | 128 | 1 | 8 | 128 |

TABLE 4B

| | Symbol Index | | | | | | | | |
|---|---|---|---|---|---|---|---|---|---|
| | 5 | | | 6 | | | 7 | | |
| Content | F | CP | D | F | CP | D | F | CP | D |
| Sample Size At 1.92 MHz | 1 | 8 | 128 | 1 | 8 | 128 | 1 | 8 | 128 |

Transmission filtering and DAC may then be completed at pre-digital-to-analog conversion (DAC) transmission digital filtering and DAC stage 320-$b$ using the 1.92 MHz sampling rate. The narrowband waveform may then be up-converted to RF and transmitted at RF stage 325-$b$. Thus, in the example of signal processing flow 302, a first reduced sampling rate sub-process 330-$b$ (e.g., at 240 kHz) may be used during the IFFT stage 310-$b$ and the CP insertion stage 365, and a second reduced sampling rate sub-process 330-$c$ (e.g., at 1.92 MHz) may be used at the interpolation and filling stage 335 and the pre-DAC transmission digital filtering and DAC stage 320-$a$.

In the example depicted in FIG. 3C, signal processing flow 303 may represent a process using a 1.92 Mhz sampling rate. Signal processing flow 303 may also use extended overlapping symbol windows to improve spectral shaping. In signal processing flow 303, a number of zeros (e.g., 116) may be padded to 12 data tones for symbol at zero padding stage 305-$c$. At IFFT stage 310-$c$, a size-16 or size-32 or size 64 IFFT, for example, and may be used to generate a time domain symbol. Sampling rates other than 1.9 MHz may also be used and the size of the IFFT may depend on the sampling rate. In some cases, N may be small relative to the IFFT size used in the system bandwidth. Examples of different sampling frequencies and the associated IFFT sizes are shown in Table 5.

TABLE 5

| $F_s$ | IFFT Size-N |
|---|---|
| 240 kHz | 16 |
| 480 kHz | 32 |
| 960 kHz | 64 |

At CP and postfix insertion stage 340, a CP and a postfix may be added to the N samples of the IFFT. At window extension stage 345, an extended sample window may be generated based on the number of samples, which in some cases may include the CP, data samples, and the postfix. At overlap stage 350, adjacent symbols may be overlapped and added prior to performing filtering at pre-DAC transmission digital filtering stage 355. At DAC stage 360, DAC may be completed and the narrowband waveform may then be up-converted to RF and transmitted at RF stage 325-$c$. Thus, the reduced sampling rate may be used for the size-N IFFT at IFFT stage 310-$c$, CP and postfix insertion stage 340, the window extension stage 345, the overlap stage 350, the pre-DAC transmission digital filtering stage 355, and the DAC stage 360.

Figure 4A:
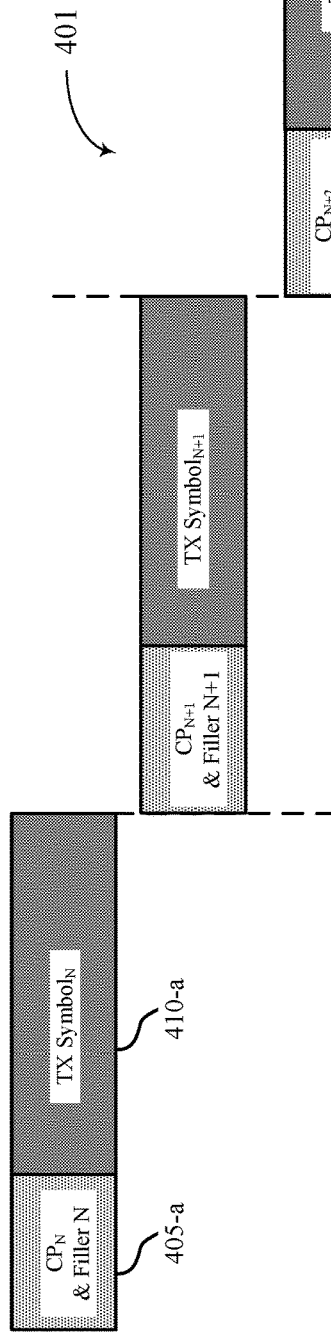
FIGS. 4A and 4B illustrate examples of symbol boundary alignments for systems that support narrowband operation with reduced sampling rate in accordance with various aspects of the present disclosure.
Figure 4B:
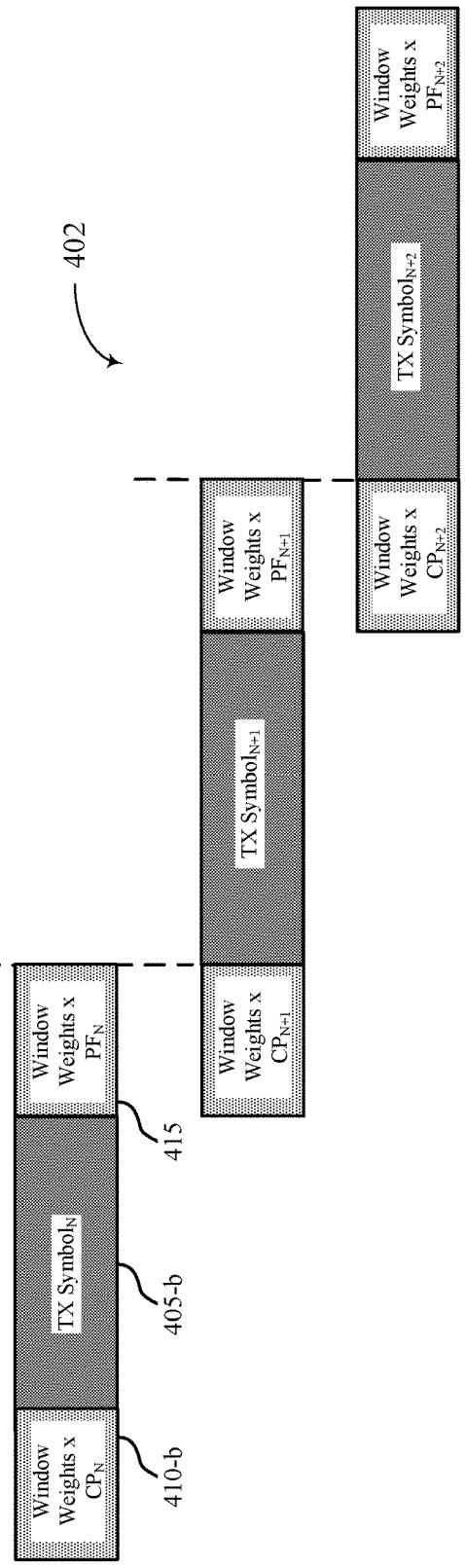

FIGS. 4A and 4B illustrate examples of symbol boundary alignment 401 and symbol boundary alignment 402 for systems that support narrowband operation with reduced sampling rate in accordance with various aspects of the present disclosure. Symbol boundary alignment 401 and symbol boundary alignment 402 may be used by a UE 115 and base station 105 described with reference to FIGS. 1-2.

Symbol boundary alignment 401 depicts an example symbol boundary alignment in which each symbol period includes a CP and filler duration 405-$a$ and a data symbol duration 410-$a$, such that each CP and filler duration 405-$a$ may begin at the end of the data symbol duration 410-$a$. Symbol boundary alignment 401 may represent a timing configuration used by some systems that support signal processing at a reduced sampling rate such as with signal processing flow 301 and signal processing flow 302.

In the example depicted in FIG. 4B, symbol boundary alignment 402 provides an example of symbol boundary alignment with an extended window that may be used in conjunction with a postfix that overlaps the CP as in signal processing flow 303. A CP and filler duration 405-*b*, which may be scaled or weighted by a "window" or overlap value, may be added to each data symbol duration 410-*b*, and a postfix 415, which may also be scaled or weighted by the window or overlap value may also be added to the end of the data symbol duration 410-*b*. This may result in an extended, overlapping time window for each symbol.

Figure 5:
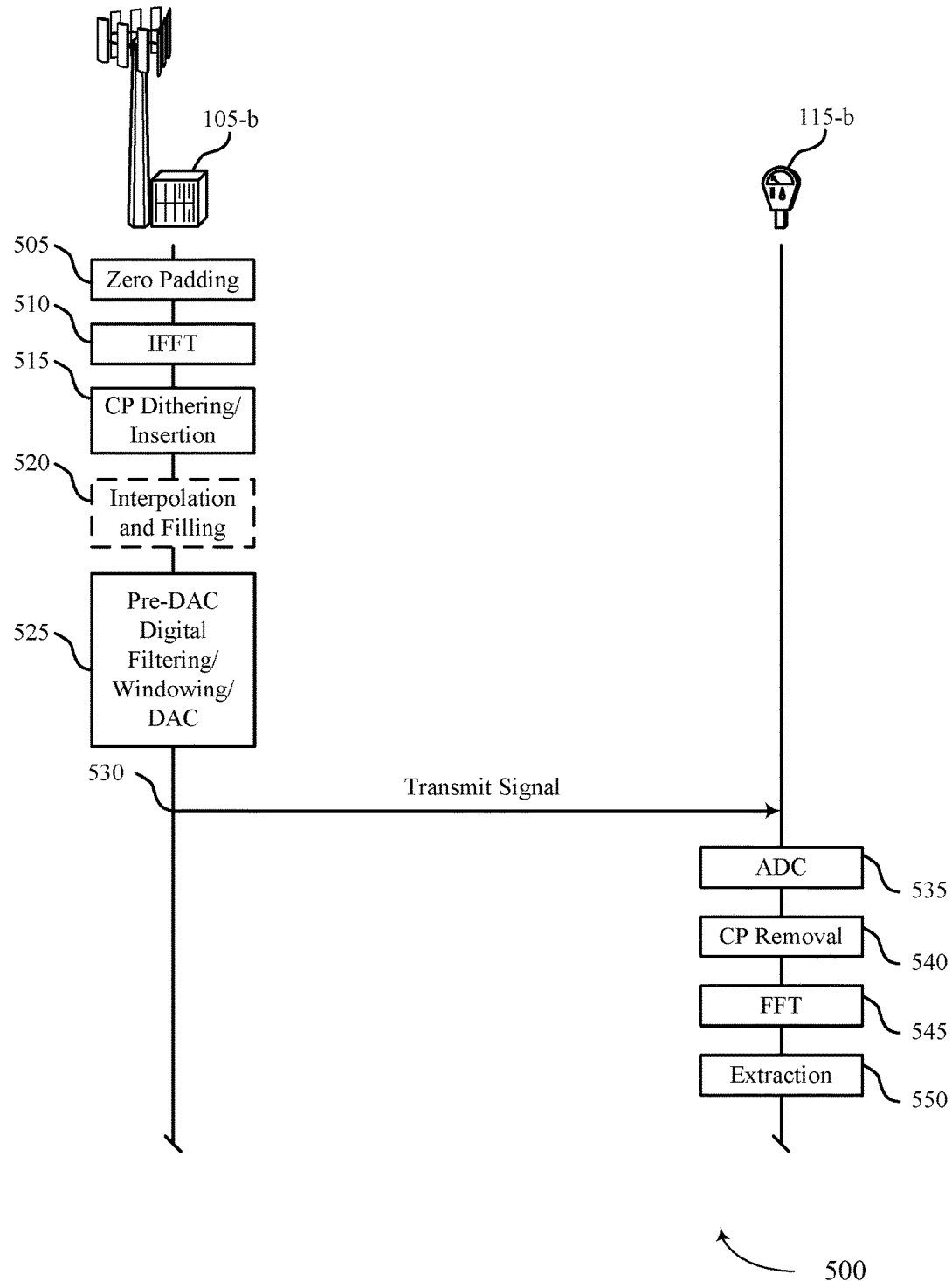
FIG. 5 illustrates an example of a process flow for systems that support narrowband operation with reduced sampling rate in accordance with various aspects of the present disclosure.

FIG. 5 illustrates an example of a process flow 500 for systems that support narrowband operation with reduced sampling rate in accordance with various aspects of the present disclosure. Process flow 500 may include steps performed by a UE 115-*b* and base station 105-*b*, which may be examples of a UE 115 and base station 105 described with reference to FIGS. 1-2. Although process flow represents an example in which base station 105-*b* generates and transmits a signal at a reduced sampling rate for reception by UE 115-*b*, either device may be alternate between transmitting and receiving reduced sampling rate signals.

At step 505, base station 105-*b* may generate a sequence and add a number of zeros to the sequence based on a first sampling rate that may be less than a second sampling rate associated with the system bandwidth. At step 510, base station 105-*b* may perform an IFFT to convert the sequence to a time domain signal.

At step 515, base station 105-*b* may dither or insert a CP based on a number of samples from the data symbol. That is, base station 105-*b* may generate a first CP, and the first CP may be associated with the first sampling rate. In some cases, base station 105 may also generate a second CP and a third CP associated with the first sampling rate, where the first CP may have a first duration and the second and third CPs may have a second duration that may be shorter than the first duration. In some examples, a transmitted signal includes a first symbol period with the first CP, a second symbol period with the second CP, and a third symbol period with the third CP. In some cases, the first symbol period aligns with a symbol period associated with the system bandwidth, and a first pair of symbol periods, including the second and third symbol periods, aligns with a second pair of symbol periods associated with the system bandwidth.

In some examples (e.g., as described with reference to FIG. 3C), base station 105-*b* may append a postfix to the sequence, such that the signal includes a first symbol window and a second symbol window, the first symbol window including the sequence, the first CP, and the postfix. In some examples, the postfix of the first symbol window overlaps a second CP of the second symbol window. In some examples, base station 105-*b* may also apply a low latency transmission filter based on a spectral mask.

In some cases (e.g., as described with reference to FIG. 3B), base station 105-*b* may convert symbols associated with the first sampling rate to a third sampling rate that may be greater than the first sampling rate and less than the second sampling rate. In some examples, generating the sequence includes performing an inverse fast Fourier transform based on the first sampling rate.

At step 520, if the signal is up-converted, for instance, base station 105-*b* may generate filler samples at the third sampling rate, such that the signal includes symbols having a filler sample. In some cases, symbol periods associated with the narrowband region may align with symbol periods associated with the system bandwidth.

At step 525, base station 105-*b* may perform pre-DAC digital filtering, windowing, or a DAC, or some combination of all of these operations, based on the reduced (e.g., the first or third) sampling rate. At step 530, base station 105-*b* may transmit a signal including the sequence and the first CP in the narrowband region.

The UE 115-*b* may receive the signal at the reduced sampling rate in the narrowband region. Then at step 535, the perform an ADC, at step 540 UE 115-*b* may remove the CP, and at step 545 UE 115-*b* may perform an FFT to generate a frequency domain signal. Then at step 550, UE 115-*b* may extract the data from the received signal. That is, UE 115-*b* may identify a first set of samples of the signal at the first sampling rate, such that a sample of the first set of samples corresponds to a first CP associated with the first sampling rate.

In some cases, the UE 115-*b* may identify a second set of samples of the signal at the first sampling rate, such that a sample of the second set of samples corresponds to a second CP associated with the first sampling rate. In some cases, the first set of samples corresponds to a symbol period of a timing configuration associated with the narrowband region, where subframes of the timing configuration associated with the narrowband region may align with subframes of a timing configuration associated with the system bandwidth. In some examples, the first set of samples includes a filler sample associated with the third sampling rate, and the subset of the first set of samples excludes the filler sample.

In some examples, UE 115-*b* may identify a third set of samples of the signal at the first sampling rate, such that a sample of the third set of samples corresponds to the first CP. In some cases, the first set of samples corresponds to a first symbol period of a subframe, the second set of samples corresponds to a second symbol period of the subframe following the first symbol period, and the third set of samples corresponds to a third symbol period of the subframe following the second symbol period. In some examples, a first pair, including the second and third symbol periods, aligns with a second pair of symbol periods associated with the system bandwidth. In some examples the signal may include symbol periods of a timing configuration associated with the narrowband region, where subframes of the timing configuration associated with the narrowband region may align with subframes of a timing configuration associated with the system bandwidth.

Figure 6:
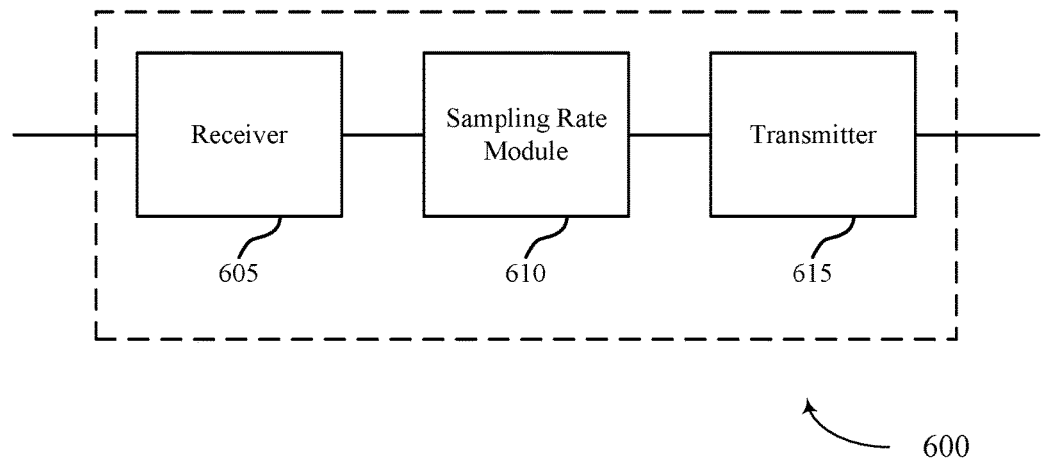
FIGS. 6-8 show diagrams of a wireless device or devices that support narrowband operation with reduced sampling rate in accordance with various aspects of the present disclosure.

FIG. 6 shows a diagram of a wireless device 600 that supports narrowband operation with reduced sampling rate in accordance with various aspects of the present disclosure. Wireless device 600 may be an example of aspects of a UE 115 or base station 105 described with reference to FIGS. 1-5. Wireless device 600 may include a receiver 605, a sampling rate module 610, or a transmitter 615. Wireless device 600 may also include a processor. Each of these components may be in communication with one another.

The receiver 605 may receive information such as packets, user data, or control information associated with various information channels (e.g., control channels, data channels, and information related to narrowband operation with reduced sampling rate, etc.). Information may be passed on to the sampling rate module 610, and to other components of wireless device 600.

The sampling rate module 610 may generate a sequence based on a first sampling rate that is less than a second sampling rate associated with the system bandwidth, generate a first CP, and, in combination with the transmitter 615, for instance, transmit a signal including the sequence and the first CP in the narrowband region. The first CP may be associated with the first sampling rate.

The transmitter 615 may transmit signals received from other components of wireless device 600. In some examples, the transmitter 615 may be collocated with the receiver 605 in a transceiver module. The transmitter 615 may include a single antenna, or it may include a plurality of antennas.

Figure 7:
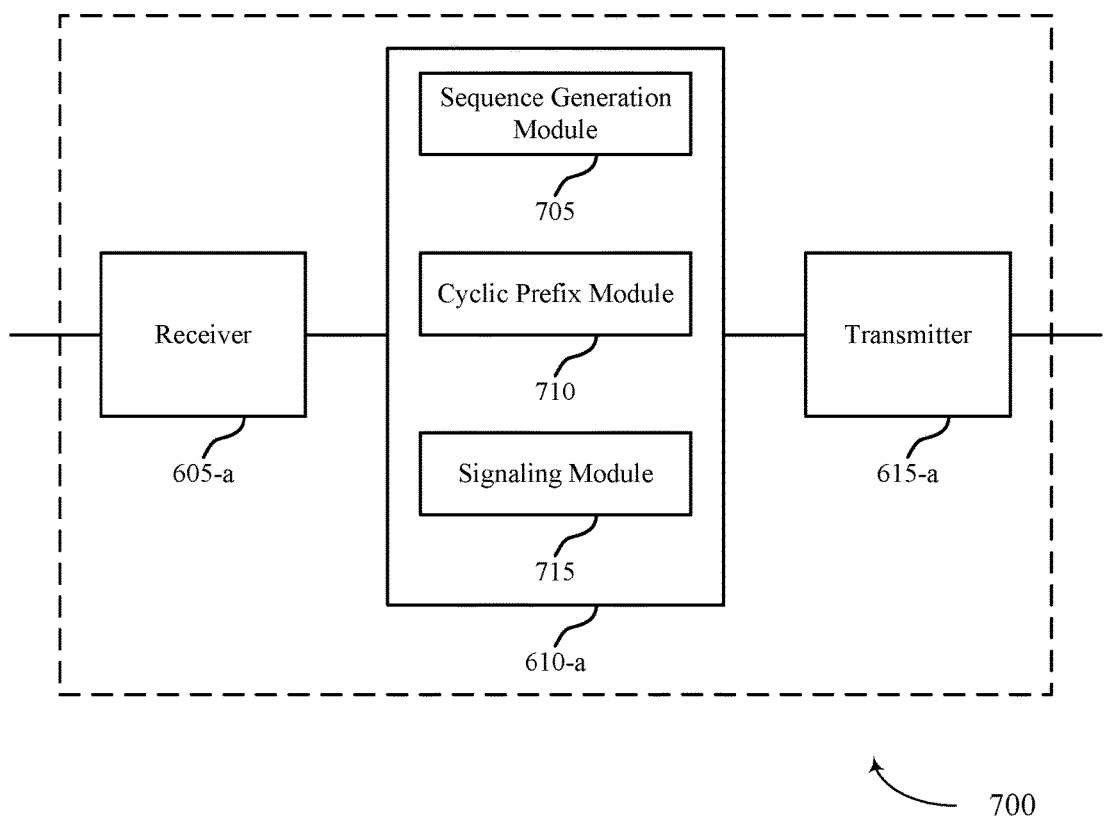

FIG. 7 shows a diagram of a wireless device 700 that supports narrowband operation with reduced sampling rate in accordance with various aspects of the present disclosure. Wireless device 700 may be an example of aspects of a wireless device 600, a base station 105 or a UE 115 described with reference to FIGS. 1-6. Wireless device 700 may include a receiver 605-*a*, a sampling rate module 610-*a*, or a transmitter 615-*a*. Wireless device 700 may also include a processor. Each of these components may be in communication with one another. The sampling rate module 610-*a* may also include a sequence generation module 705, a cyclic prefix module 710, and a signaling module 715.

The receiver 605-*a* may receive information which may be passed on to sampling rate module 610-*a*, and to other components of wireless device 700. The sampling rate module 610-*a* may perform the operations described with reference to FIG. 6. The transmitter 615-*a* may transmit signals received from other components of wireless device 700.

The sequence generation module 705 may generate a sequence based on a first sampling rate that is less than a second sampling rate associated with the system bandwidth, as described with reference to FIGS. 2-5. In some examples, generating the sequence includes performing an inverse fast Fourier transform using the first sampling rate. In some examples, generating the sequence includes performing a digital-to-analog conversion based on the first sampling rate.

The cyclic prefix module 710 may generate a first CP, and the first CP may be associated with the first sampling rate, as described with reference to FIGS. 2-5. The cyclic prefix module 710 may also generate a second CP and a third CP associated with the first sampling rate, and the first CP may have a first duration and the second and third CPs have a second duration that is shorter than the first duration.

The signaling module 715 may, in combination with the transmitter 615-*a*, transmit a signal including the sequence and the first CP in the narrowband region, as described with reference to FIGS. 2-5. In some examples, the signal includes a first symbol period with the first CP, a second symbol period with the second CP, and a third symbol period with the third CP. In some examples, the first symbol period aligns with a symbol period associated with the system bandwidth, where a first pair that includes the second and third symbol periods aligns with a second pair of symbol periods associated with the system bandwidth. In some examples, the signal includes symbol periods of a timing configuration associated with the narrowband region, and the subframes of the timing configuration associated with the narrowband region may align with subframes of a timing configuration associated with the system bandwidth. The signaling module 715 may, in combination with the receiver 605-*a*, also receive a signal in the narrowband region, the signal based on a first sampling rate that is less than a second sampling rate associated with the system bandwidth.

Figure 8:
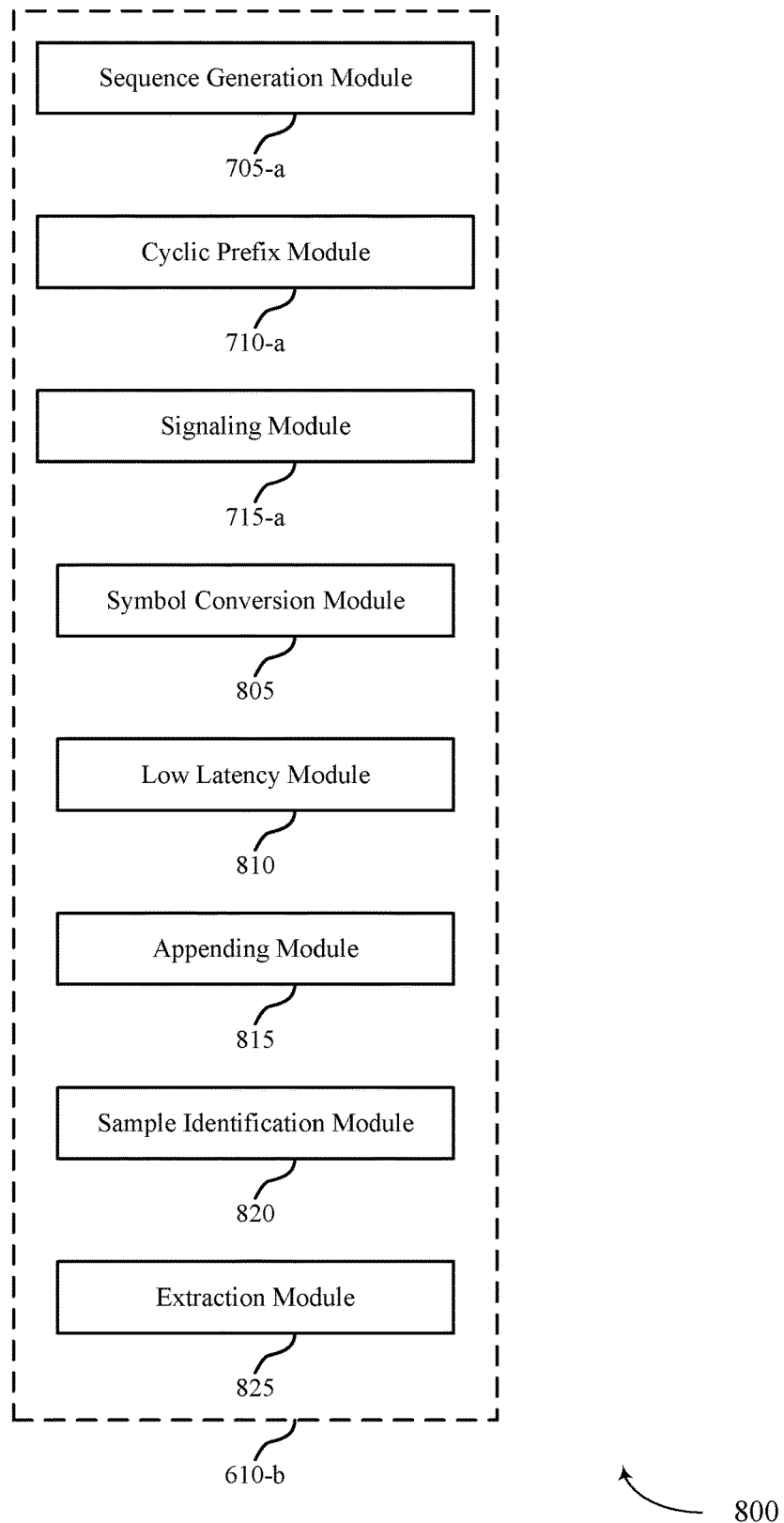

FIG. 8 shows a diagram 800 of a sampling rate module 610-*b*, which may be a component of a wireless device 600 or a wireless device 700 that supports narrowband operation with reduced sampling rate in accordance with various aspects of the present disclosure. The sampling rate module 610-*b* may be an example of aspects of a sampling rate module 610 described with reference to FIGS. 6-7. The sampling rate module 610-*b* may include a sequence generation module 705-*a*, a cyclic prefix module 710-*a*, and a signaling module 715-*a*. Each of these modules may perform the functions described with reference to FIG. 7. The sampling rate module 610-*b* may also include a symbol conversion module 805, a low latency module 810, an appending module 815, a sample identification module 820, and an extraction module 825.

The symbol conversion module 805 may convert symbols associated with the first sampling rate to a third sampling rate that is greater than the first sampling rate and less than the second sampling rate as described with reference to FIGS. 2-5. The symbol conversion module 805 may also generate filler samples at the third sampling rate, and the signal may include symbols having one or several filler samples. The symbol conversion module 805 may also ensure that symbol periods associated with the narrowband region align with symbol periods associated with the system bandwidth.

The low latency module 810 may apply a low latency transmission filter on a spectral mask as described with reference to FIGS. 2-5. The appending module 815 may append a postfix to the sequence, and the signal may include a first symbol window and a second symbol window, where the first symbol window includes the sequence, the first CP, and the postfix, as described with reference to FIGS. 2-5. In some examples, the postfix of the first symbol window overlaps a second CP of the second symbol window.

The sample identification module 820 may identify a first set of samples of the signal at the first sampling rate; one or several samples of the first set of samples may correspond to a first CP associated with the first sampling rate, as described with reference to FIGS. 2-5. The sample identification module 820 may also identify a second set of samples of the signal at the first sampling rate, and samples of the second set of samples may correspond to a second CP associated with the first sampling rate. The sample identification module 820 may also identify a third set of samples of the signal at the first sampling rate; samples of the third set of samples may correspond to the first CP.

In some examples, the first set of samples corresponds to a first symbol period of a subframe, the second set of samples corresponds to a second symbol period of the subframe following the first symbol period, and the third set of samples corresponds to a third symbol period of the subframe following the second symbol period. In some cases, a first pair including the second and third symbol periods aligns with a second pair of symbol periods associated with the system bandwidth. Additionally or alternatively, the first set of samples may correspond to a symbol period of a timing configuration associated with the narrowband region, and subframes of the timing configuration associated with the narrowband region may align with subframes of a timing configuration associated with the system bandwidth.

The extraction module 825 may extract information from some of the first set of samples. The subset from which information is extracted may exclude samples that corresponds to the first CP, as described with reference to FIGS. 2-5. The extraction module 825 may also process the subset of the first set of samples at a third sampling rate that is less than the first sampling rate. In some examples, the first set of samples includes a filler sample associated with the third sampling rate, and the subset of the first set of samples from which information is extracted excludes the filler sample. The extraction module 825 may, in some examples, ensure that symbol periods associated with the narrowband region align with symbol periods associated with the system bandwidth.

The components of wireless device 600, wireless device 700, and sampling rate module 610 may, individually or collectively, be implemented with at least one application specific integrated circuit (ASIC) adapted to perform some or all of the applicable functions in hardware. Alternatively, the functions may be performed by one or more other processing units (or cores), on at least one integrated circuit (IC). In other examples, other types of ICs may be used (e.g., Structured/Platform ASICs, a field programmable gate array (FPGA), or another semi-custom IC), which may be programmed in any manner known in the art. The functions of each unit may also be implemented, in whole or in part, with instructions embodied in a memory, formatted to be executed by one or more general or application-specific processors.

Figure 9:
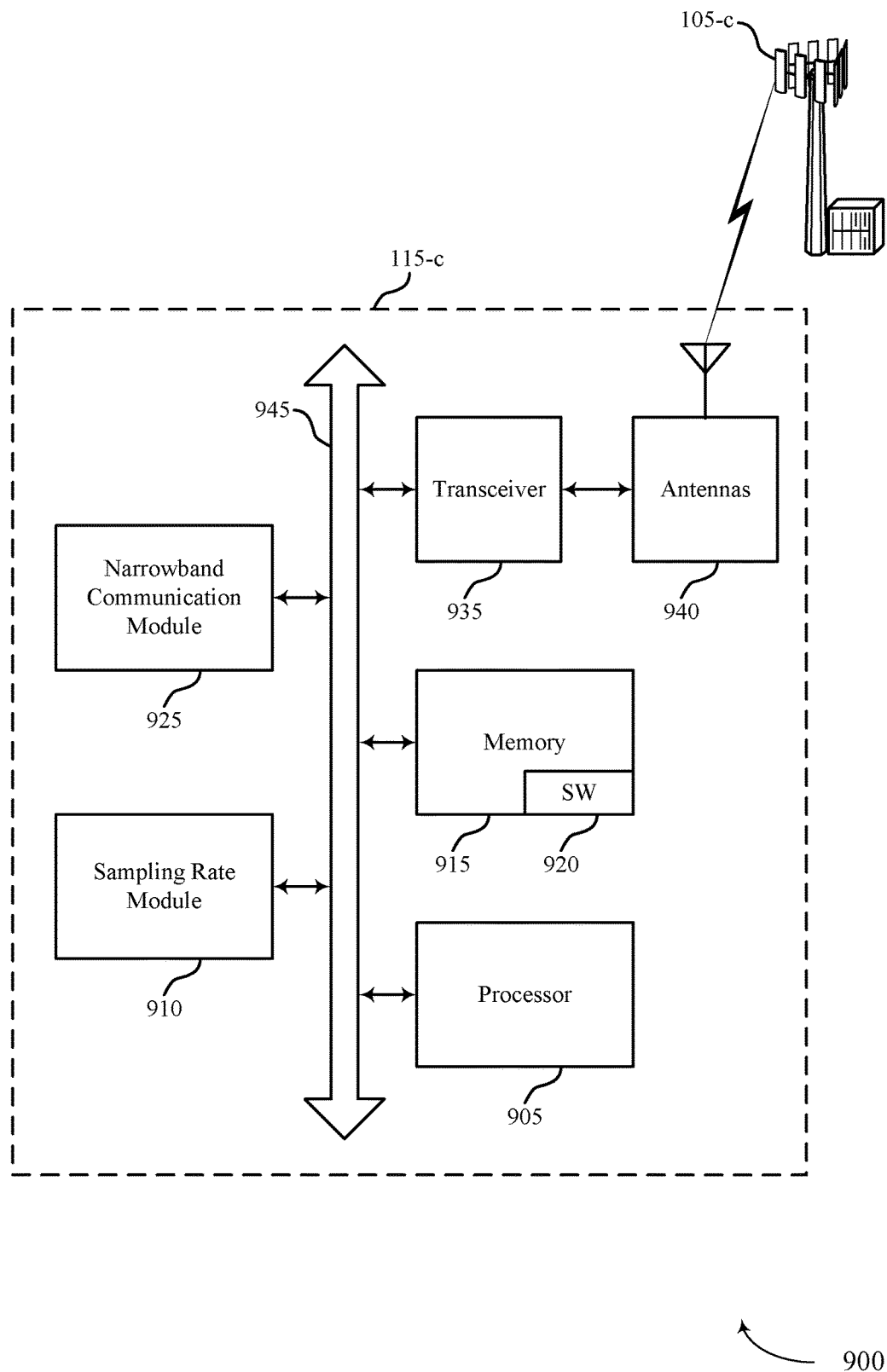
FIG. 9 illustrates a diagram of a system, including a wireless device that supports narrowband operation with reduced sampling rate in accordance with various aspects of the present disclosure.

FIG. 9 shows a diagram of a system 900, including a wireless device (e.g., a UE 115, which may be an MTC device) that supports narrowband operation with reduced sampling rate in accordance with various aspects of the present disclosure. System 900 may include UE 115-c, which may be an example of a wireless device 600, a wireless device 700, or a UE 115 described with reference to FIGS. 1, 2 and 6-8. UE 115-c may include a sampling rate module 910, which may be an example of a sampling rate module 610 described with reference to FIGS. 6-8. UE 115-c may also include a narrowband communication module 925, which may enable communications in a subband of a total system bandwidth. UE 115-c may also include components for bi-directional voice and data communications including components for transmitting communications and components for receiving communications. For example, UE 115-c may communicate bi-directionally with base station 105-c.

UE 115-c may also include a processor 905, and memory 915 (including software (SW) 920), a transceiver 935, and one or more antenna(s) 940, each of which may communicate, directly or indirectly, with one another (e.g., via buses 945). The transceiver 935 may communicate bi-directionally, via the antenna(s) 940 or wired or wireless links, with one or more networks, as described above. For example, the transceiver 935 may communicate bi-directionally with a base station 105 or another UE 115. The transceiver 935 may include a modem to modulate the packets and provide the modulated packets to the antenna(s) 940 for transmission, and to demodulate packets received from the antenna(s) 940. While UE 115-c may include a single antenna 940, UE 115-c may also have multiple antennas 940 capable of concurrently transmitting or receiving multiple wireless transmissions.

The memory 915 may include random access memory (RAM) and read only memory (ROM). The memory 915 may store computer-readable, computer-executable software/firmware code 920 including instructions that, when executed, cause the processor 905 to perform various functions described herein (e.g., narrowband operation with reduced sampling rate, etc.). Alternatively, the computer-executable software/firmware code 920 may not be directly executable by the processor 905 but cause a computer (e.g., when compiled and executed) to perform functions described herein. The processor 905 may include an intelligent hardware device, (e.g., a central processing unit (CPU), a microcontroller, an ASIC, etc.)

Figure 10:
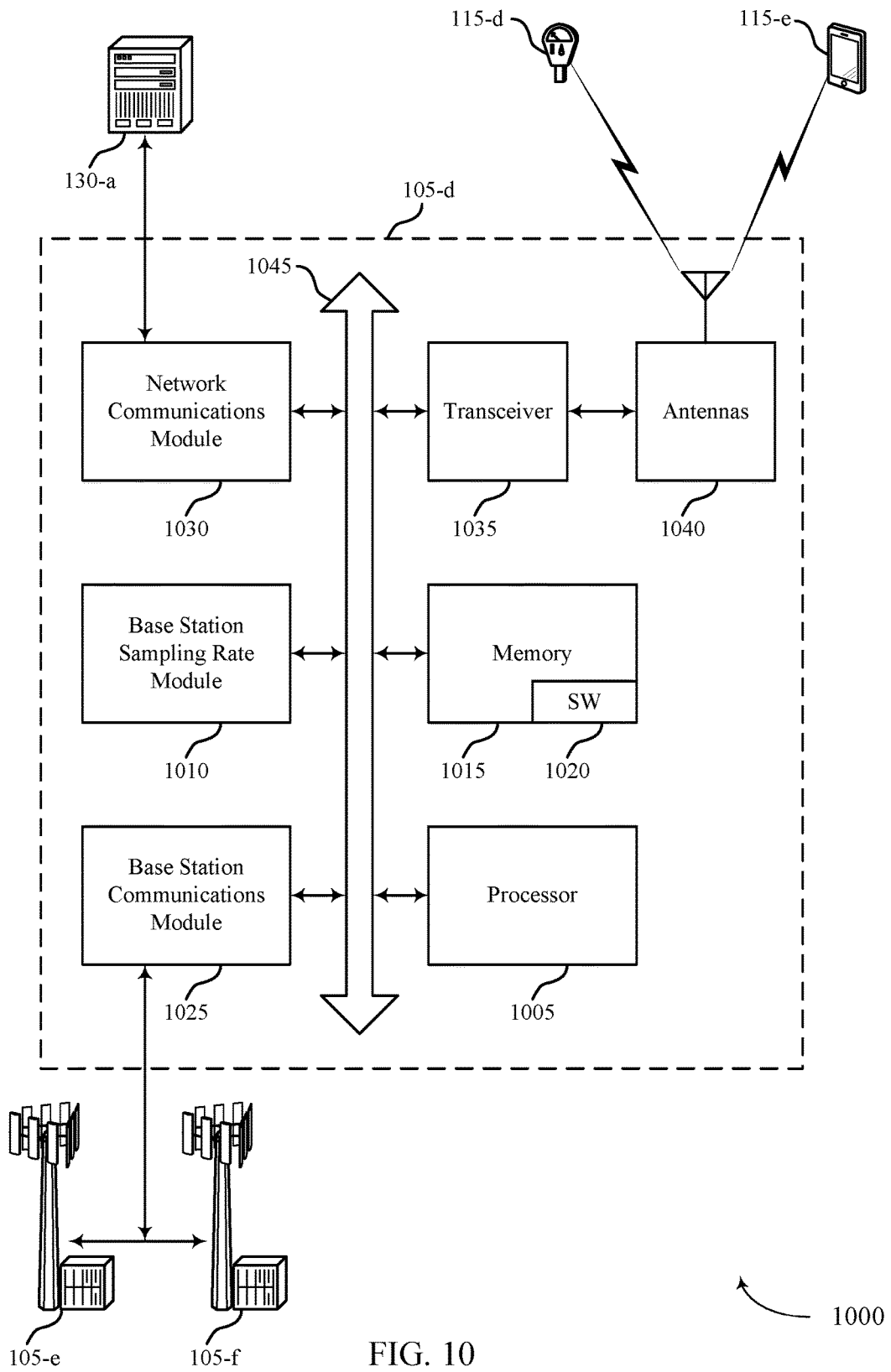
FIG. 10 illustrates a diagram of a system, including a base station that supports narrowband operation with reduced sampling rate in accordance with various aspects of the present disclosure.

FIG. 10 shows a diagram of a system 1000, including a base station that supports narrowband operation with reduced sampling rate in accordance with various aspects of the present disclosure. System 1000 may include base station 105-d, which may be an example of a wireless device 600, a wireless device 700, or a base station 105 described with reference to FIGS. 1, 2 and 7-9. Base station 105-d may include a base station sampling rate module 1010, which may be an example of a base station sampling rate module 1010 described with reference to FIGS. 7-9. Base station 105-d may also include components for bi-directional voice and data communications including components for transmitting communications and components for receiving communications. For example, base station 105-d may communicate bi-directionally with UE 115-d (i.e., an MTC device) or UE 115-e.

In some cases, base station 105-d may have one or more wired backhaul links. Base station 105-d may have a wired backhaul link (e.g., S1 interface, etc.) to the core network 130. Base station 105-d may also communicate with other base stations 105, such as base station 105-e and base station 105-f via inter-base station backhaul links (e.g., an X2 interface). Each of the base stations 105 may communicate with UEs 115 using the same or different wireless communications technologies. In some cases, base station 105-d may communicate with other base stations such as 105-e or 105-f utilizing base station communication module 1025. In some examples, base station communication module 1025 may provide an X2 interface within a LTE/LTE-A wireless communication network technology to provide communication between some of the base stations 105. In some examples, base station 105-d may communicate with other base stations through core network 130. In some cases, base station 105-d may communicate with the core network 130 through network communications module 1030.

The base station 105-d may include a processor 1005, memory 1015 (including SW 1020), transceiver 1035, and antenna(s) 1040, which each may be in communication, directly or indirectly, with one another (e.g., over bus system 1045). The transceivers 1035 may be configured to communicate bi-directionally, via the antenna(s) 1040, with the UEs 115, which may be multi-mode devices. The transceiver 1035 (or other components of the base station 105-d) may also be configured to communicate bi-directionally, via the antennas 1040, with one or more other base stations (not shown). The transceiver 1035 may include a modem configured to modulate the packets and provide the modulated packets to the antennas 1040 for transmission, and to demodulate packets received from the antennas 1040. The base station 105-d may include multiple transceivers 1035, each with one or more associated antennas 1040. The transceiver may be an example of a combined receiver 605 and transmitter 615 of FIG. 6.

The memory 1015 may include RAM and ROM. The memory 1015 may also store computer-readable, computer-executable software code 1020 containing instructions that are configured to, when executed, cause the processor 1005 to perform various functions described herein (e.g., narrowband operation with reduced sampling rate, selecting coverage enhancement techniques, call processing, database management, message routing, etc.). Alternatively, the software 1020 may not be directly executable by the processor 1005 but be configured to cause the computer, e.g., when compiled and executed, to perform functions described herein. The processor 1005 may include an intelligent hardware device, e.g., a CPU, a microcontroller, an ASIC, etc. The processor 1005 may include various special purpose processors such as encoders, queue processing modules, base band processors, radio head controllers, digital signal processor (DSPs), and the like.

The base station communication module 1025 may manage communications with other base stations 105. In some cases, a communications management module may include a controller or scheduler for controlling communications with UEs 115 in cooperation with other base stations 105. For example, the base station communication module 1025 may coordinate scheduling for transmissions to UEs 115 for various interference mitigation techniques such as beamforming or joint transmission.

Figure 11:
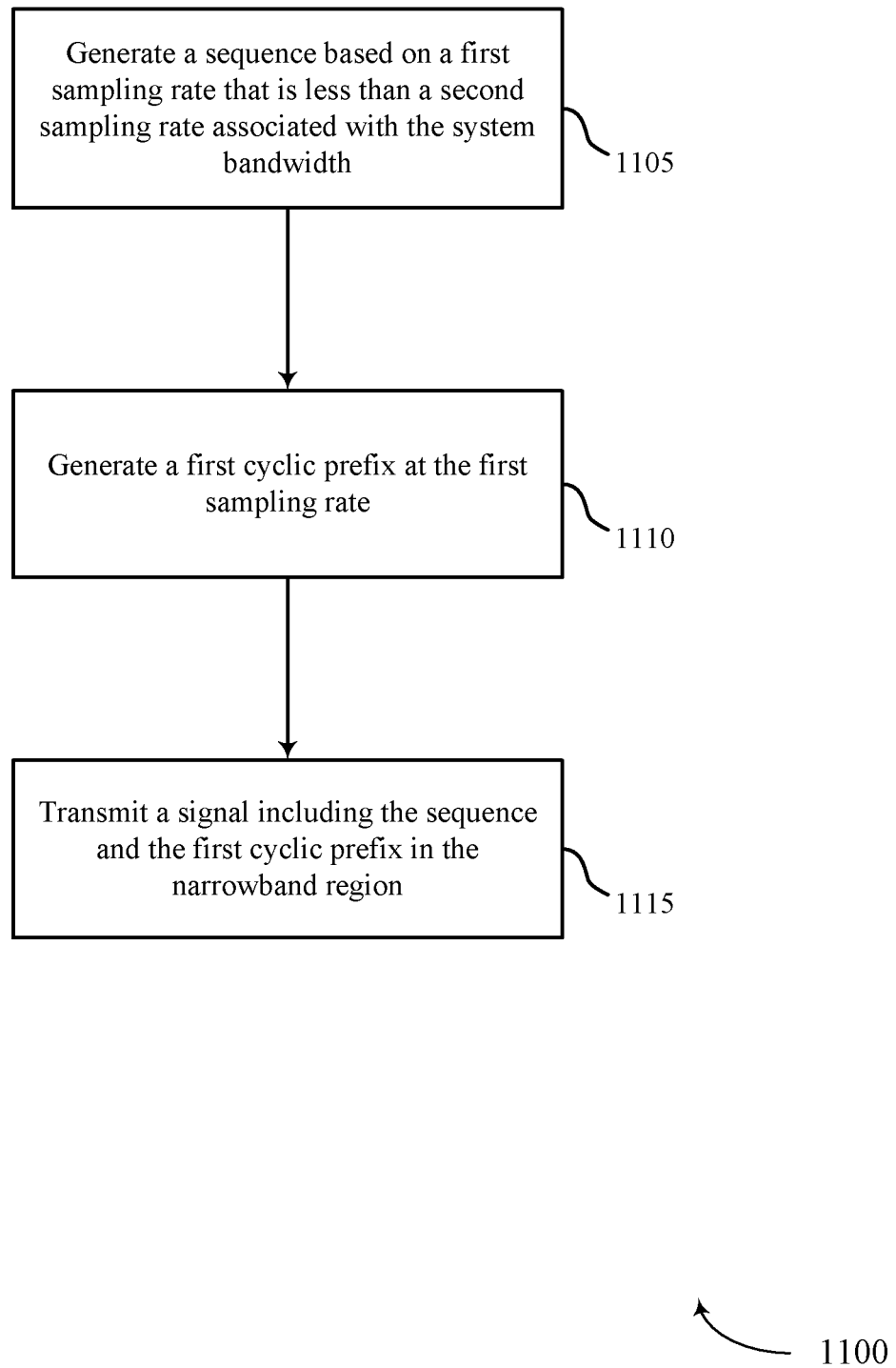
FIGS. 11-16 illustrate flowcharts illustrating methods for narrowband operation with reduced sampling rate in accordance with various aspects of the present disclosure.

FIG. 11 shows a flowchart illustrating a method 1100 for narrowband operation with reduced sampling rate in accordance with various aspects of the present disclosure. The operations of method 1100 may be implemented by a UE 115 or base station 105 or its components as described with reference to FIGS. 1-10. For example, the operations of method 1100 may be performed by the sampling rate module 610 as described with reference to FIGS. 6-9. In some examples, a UE 115 or base station 105 may execute a set of codes to control the functional elements of the UE 115 or base station 105 to perform the functions described below. Additionally or alternatively, the UE 115 or base station 105 may perform aspects the functions described below using special-purpose hardware.

At block 1105, the UE 115 or base station 105 may generate a sequence based at least in part on a first sampling rate that is less than a second sampling rate associated with the system bandwidth as described with reference to FIGS. 2-5. In some examples, the operations of block 1105 may be performed by the sequence generation module 705 as described with reference to FIG. 7.

At block 1110, the UE 115 or base station 105 may generate a first CP, where the first CP is associated with the first sampling rate as described with reference to FIGS. 2-5. In some examples, the operations of block 1110 may be performed by the cyclic prefix module 710 as described with reference to FIG. 7.

At block 1115, the UE 115 or base station 105 may transmit a signal including the sequence and the first CP in the narrowband region as described with reference to FIGS. 2-5. In some examples, the operations of block 1115 may be performed by the signaling module 715 as described with reference to FIG. 7.

Figure 12:
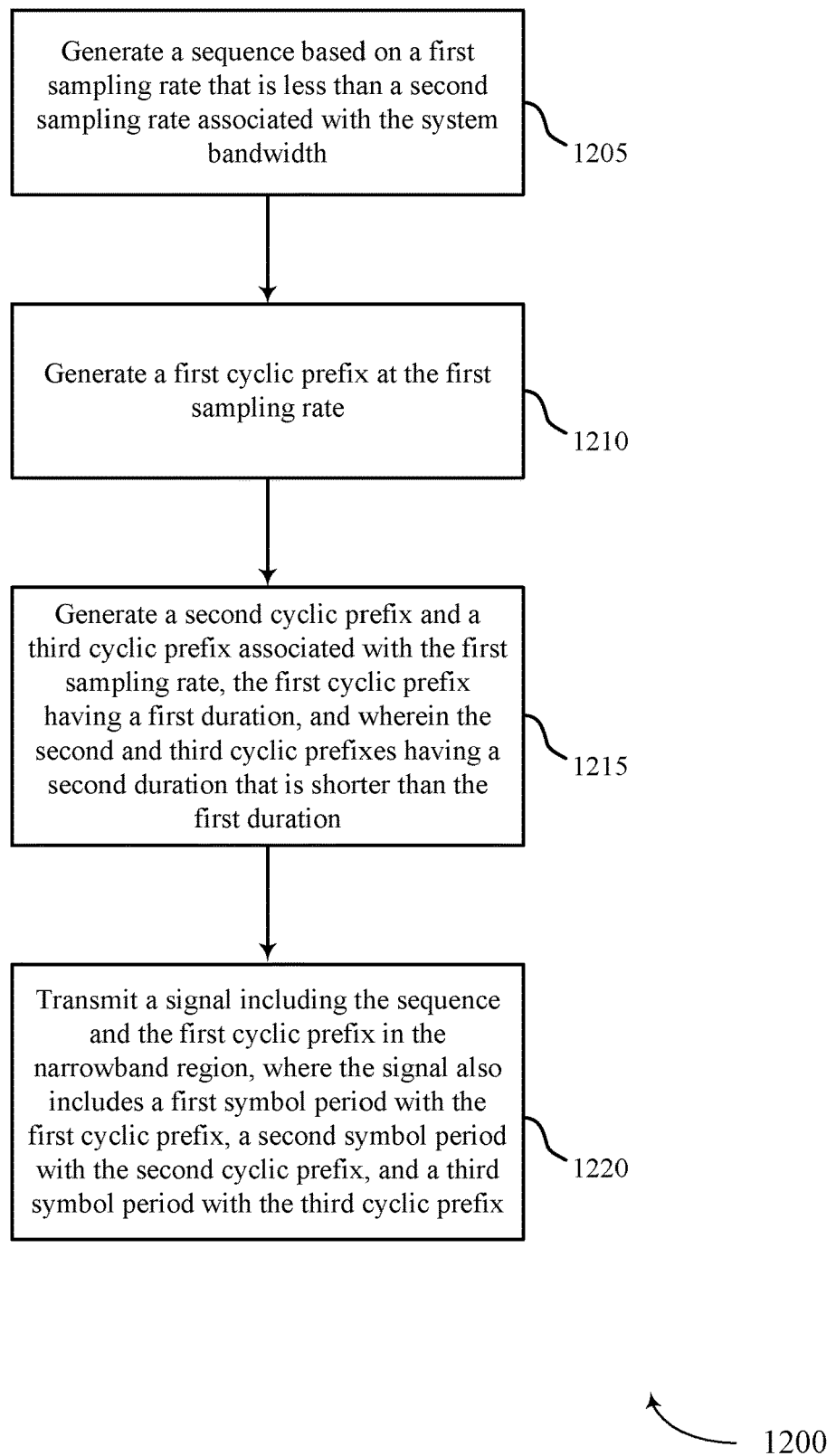

FIG. 12 shows a flowchart illustrating a method 1200 for narrowband operation with reduced sampling rate in accordance with various aspects of the present disclosure. The operations of method 1200 may be implemented by a UE 115 or base station 105 or its components as described with reference to FIGS. 1-10. For example, the operations of method 1200 may be performed by the sampling rate module 610 as described with reference to FIGS. 6-9. In some examples, a UE 115 or base station 105 may execute a set of codes to control the functional elements of the UE 115 or base station 105 to perform the functions described below. Additionally or alternatively, the UE 115 or base station 105 may perform aspects the functions described below using special-purpose hardware. The method 1200 may also incorporate aspects of method 1100 of FIG. 11.

At block 1205, the UE 115 or base station 105 may generate a sequence based at least in part on a first sampling rate that is less than a second sampling rate associated with the system bandwidth as described with reference to FIGS. 2-5. In some examples, the operations of block 1205 may be performed by the sequence generation module 705 as described with reference to FIG. 7.

At block 1210, the UE 115 or base station 105 may generate a first CP, where the first CP is associated with the first sampling rate as described with reference to FIGS. 2-5. In some examples, the operations of block 1210 may be performed by the cyclic prefix module 710 as described with reference to FIG. 7.

At block 1215, the UE 115 or base station 105 may generate a second CP and a third CP associated with the first sampling rate, where the first CP has a first duration and the second and third CPs have a second duration that is shorter than the first duration as described with reference to FIGS. 2-5. In some examples, the operations of block 1220 may be performed by the cyclic prefix module 710 as described with reference to FIG. 7.

At block 1220, the UE 115 or base station 105 may transmit a signal including the sequence and the first CP in the narrowband region as described with reference to FIGS. 2-5. In some cases, the signal includes a first symbol period with the first CP, a second symbol period with the second CP, and a third symbol period with the third CP. In some examples, the operations of block 1220 may be performed by the signaling module 715 as described with reference to FIG. 7.

Figure 13:
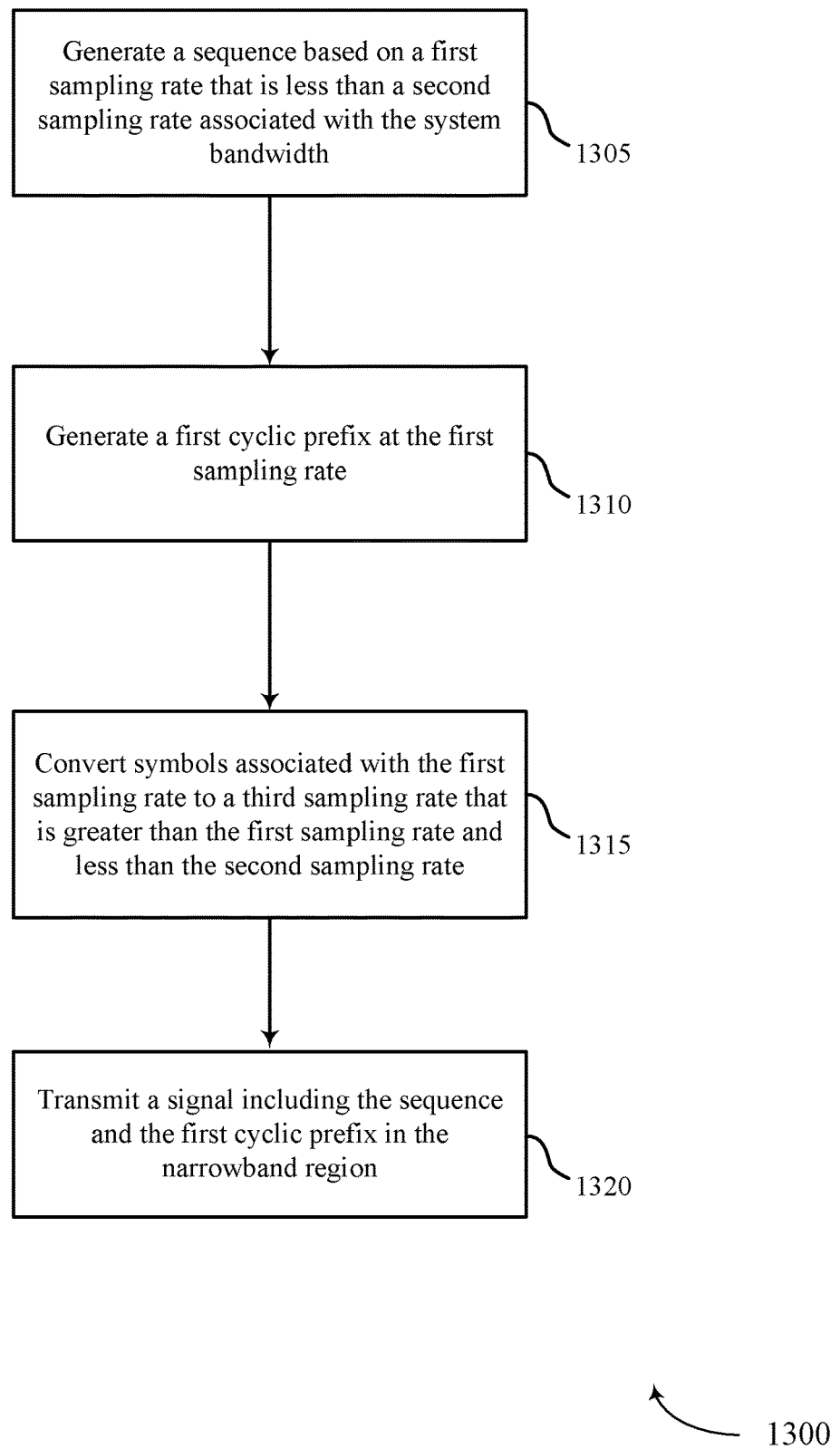

FIG. 13 shows a flowchart illustrating a method 1300 for narrowband operation with reduced sampling rate in accordance with various aspects of the present disclosure. The operations of method 1300 may be implemented by a UE 115 or base station 105 or its components as described with reference to FIGS. 1-10. For example, the operations of method 1300 may be performed by the sampling rate module 610 as described with reference to FIGS. 6-9. In some examples, a UE 115 or base station 105 may execute a set of codes to control the functional elements of the UE 115 or base station 105 to perform the functions described below. Additionally or alternatively, the UE 115 or base station 105 may perform aspects the functions described below using special-purpose hardware. The method 1300 may also incorporate aspects of methods 1100 and 1200 of FIGS. 11-12.

At block 1305, the UE 115 or base station 105 may generate a sequence based at least in part on a first sampling rate that is less than a second sampling rate associated with the system bandwidth as described with reference to FIGS. 2-5. In some examples, the operations of block 1305 may be performed by the sequence generation module 705 as described with reference to FIG. 7.

At block 1310, the UE 115 or base station 105 may generate a first CP, where the first CP is associated with the first sampling rate as described with reference to FIGS. 2-5. In some examples, the operations of block 1310 may be performed by the cyclic prefix module 710 as described with reference to FIG. 7.

At block 1315, the UE 115 or base station 105 may convert symbols associated with the first sampling rate to a third sampling rate that is greater than the first sampling rate and less than the second sampling rate as described with reference to FIGS. 2-5. In some examples, the operations of block 1315 may be performed by the symbol conversion module 805 as described with reference to FIG. 8.

At block 1320, the UE 115 or base station 105 may transmit a signal including the sequence and the first CP in the narrowband region as described with reference to FIGS. 2-5. In some examples, the operations of block 1320 may be performed by the signaling module 715 as described with reference to FIG. 7.

Figure 14:
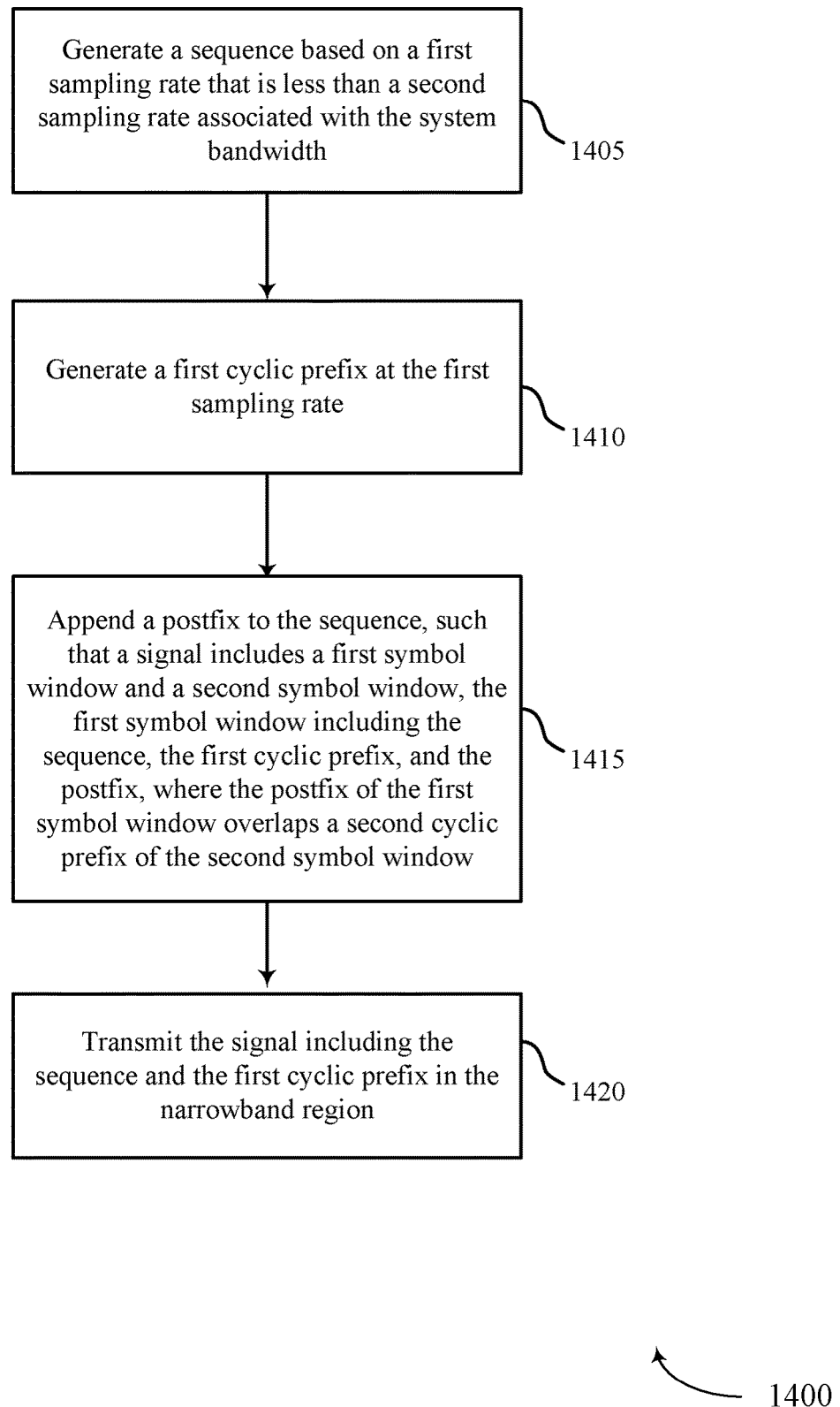

FIG. 14 shows a flowchart illustrating a method 1400 for narrowband operation with reduced sampling rate in accordance with various aspects of the present disclosure. The operations of method 1400 may be implemented by a UE 115 or base station 105 or its components as described with reference to FIGS. 1-10. For example, the operations of method 1400 may be performed by the sampling rate module 610 as described with reference to FIGS. 6-9. In some examples, a UE 115 or base station 105 may execute a set of codes to control the functional elements of the UE 115 or base station 105 to perform the functions described below. Additionally or alternatively, the UE 115 or base station 105 may perform aspects the functions described below using special-purpose hardware. The method 1400 may also incorporate aspects of methods 1100, 1200, and 1300 of FIGS. 11-13.

At block 1405, the UE 115 or base station 105 may generate a sequence based at least in part on a first sampling rate that is less than a second sampling rate associated with the system bandwidth as described with reference to FIGS. 2-5. In some examples, the operations of block 1405 may be performed by the sequence generation module 705 as described with reference to FIG. 7.

At block 1410, the UE 115 or base station 105 may generate a first CP, where the first CP is associated with the first sampling rate as described with reference to FIGS. 2-5. In some examples, the operations of block 1410 may be performed by the cyclic prefix module 710 as described with reference to FIG. 7.

At block 1415, the UE 115 or base station 105 may append a postfix to the sequence, and where a signal for future transmission includes a first symbol window and a second symbol window, the first symbol window including the sequence, the first CP, and the postfix as described with reference to FIGS. 2-5. In some cases, the postfix of the first symbol window overlaps a second CP of the second symbol window. In some examples, the operations of block 1415 may be performed by the appending module 815 as described with reference to FIG. 8.

At block 1420, the UE 115 or base station 105 may transmit the signal including the sequence and the first CP in the narrowband region as described with reference to FIGS. 2-5. In some examples, the operations of block 1420 may be performed by the signaling module 715 as described with reference to FIG. 7.

Figure 15:
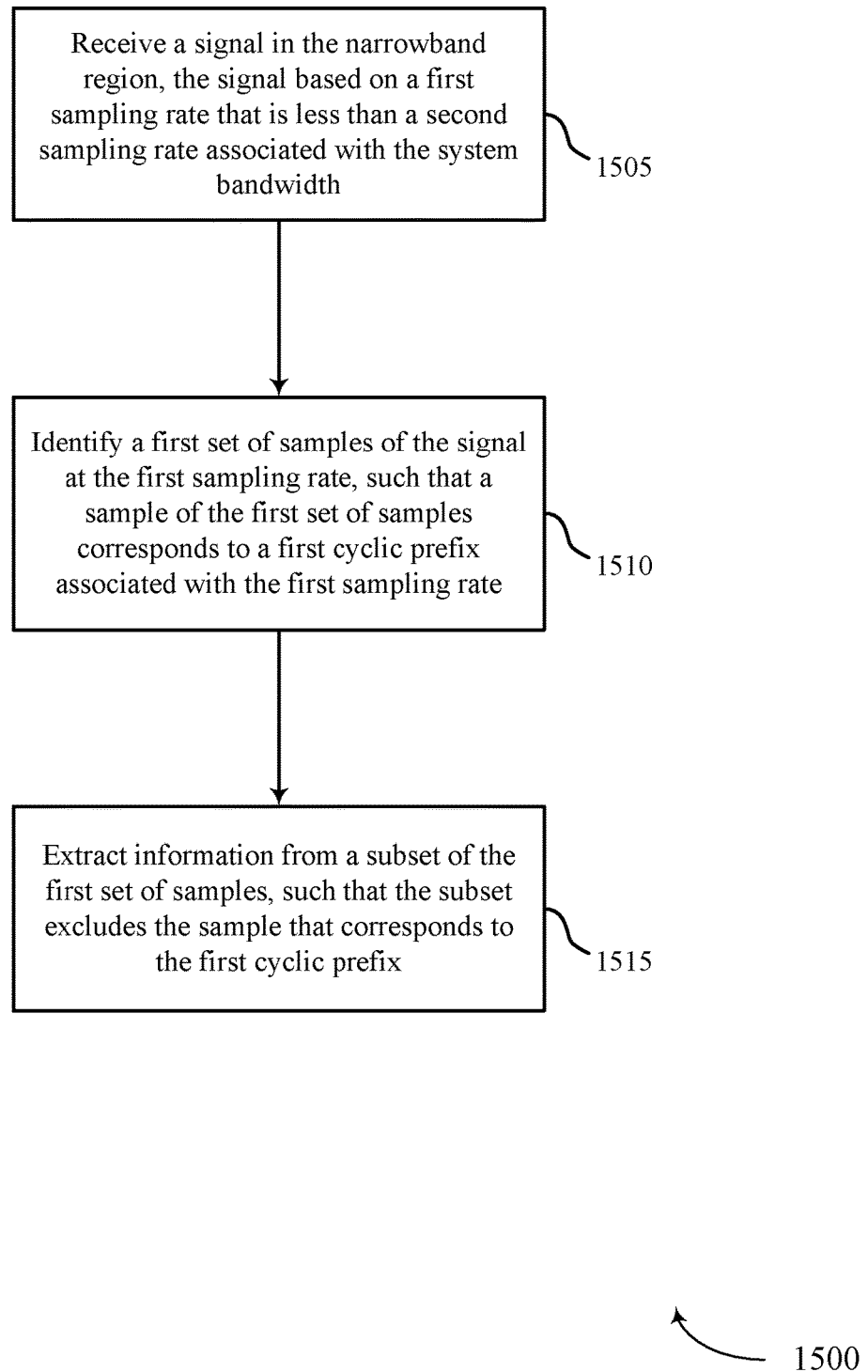

FIG. 15 shows a flowchart illustrating a method 1500 for narrowband operation with reduced sampling rate in accordance with various aspects of the present disclosure. The operations of method 1500 may be implemented by a UE 115 or base station 105 or its components as described with reference to FIGS. 1-10. For example, the operations of method 1500 may be performed by the sampling rate module 610 as described with reference to FIGS. 6-9. In some examples, a UE 115 or base station 105 may execute a set of codes to control the functional elements of the UE 115 or base station 105 to perform the functions described below. Additionally or alternatively, the UE 115 or base station 105 may perform aspects the functions described below using special-purpose hardware.

At block 1505, the UE 115 or base station 105 may receive a signal in the narrowband region, the signal based at least in part on a first sampling rate that is less than a second sampling rate associated with the system bandwidth as described with reference to FIGS. 2-5. In some examples, the operations of block 1505 may be performed by the signaling module 715 as described with reference to FIG. 7.

At block 1510, the UE 115 or base station 105 may identify a first set of samples of the signal at the first sampling rate, where at least one sample of the first set of samples corresponds to a first CP associated with the first sampling rate as described with reference to FIGS. 2-5. In some examples, the operations of block 1510 may be performed by the sample identification module 820 as described with reference to FIG. 8.

At block 1515, the UE 115 or base station 105 may extract information from a subset of the first set of samples, where the subset excludes the at least one sample that corresponds to the first CP as described with reference to FIGS. 2-5. In some examples, the operations of block 1515 may be performed by the extraction module 825 as described with reference to FIG. 8.

Figure 16:
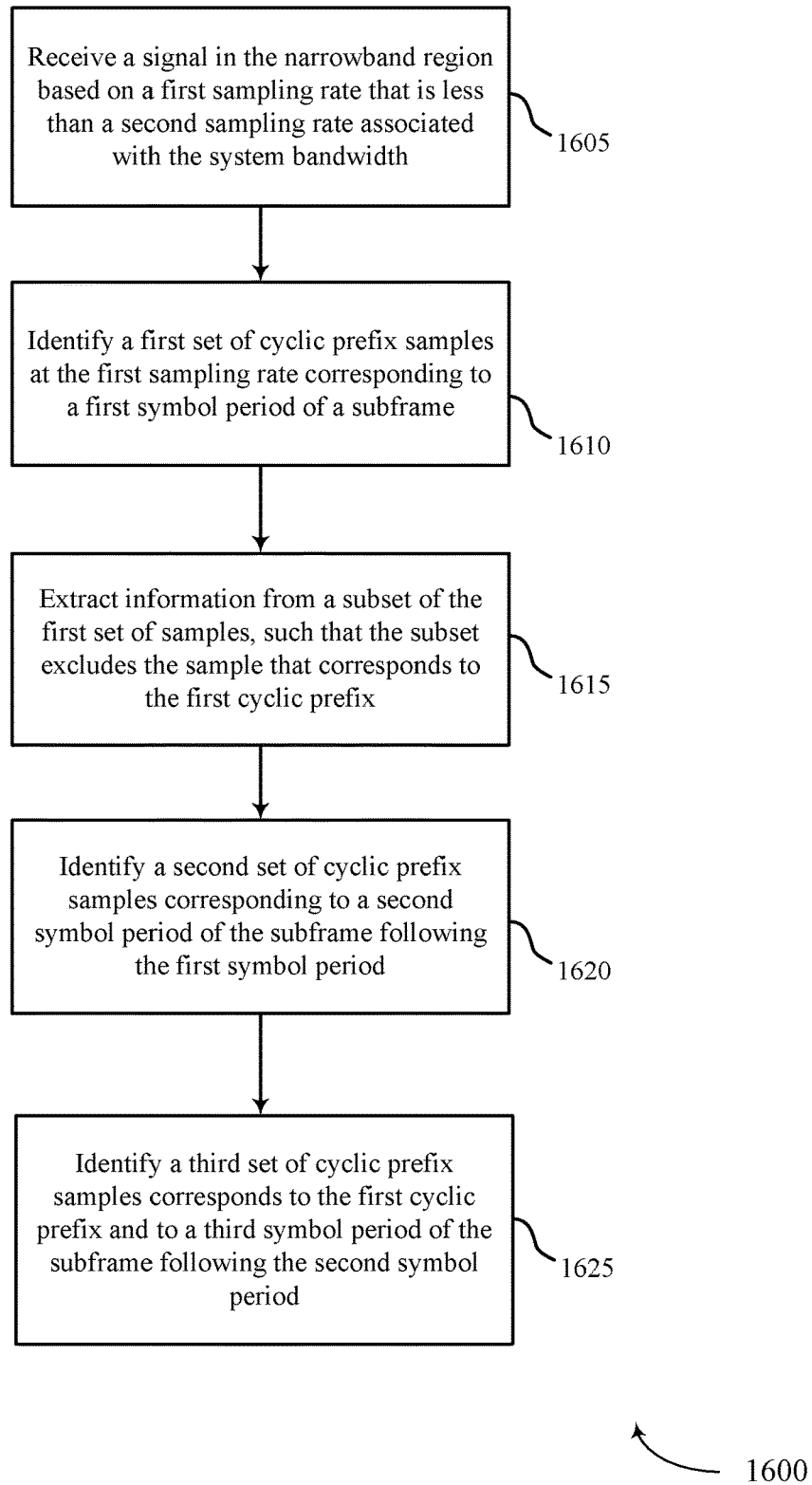

FIG. 16 shows a flowchart illustrating a method 1600 for narrowband operation with reduced sampling rate in accordance with various aspects of the present disclosure. The operations of method 1600 may be implemented by a UE 115 or base station 105 or its components as described with reference to FIGS. 1-10. For example, the operations of method 1600 may be performed by the sampling rate module 610 as described with reference to FIGS. 6-9. In some examples, a UE 115 or base station 105 may execute a set of codes to control the functional elements of the UE 115 or base station 105 to perform the functions described below. Additionally or alternatively, the UE 115 or base station 105 may perform aspects the functions described below using special-purpose hardware. The method 1600 may also incorporate aspects of method 1500 of FIG. 15.

At block 1605, the UE 115 or base station 105 may receive a signal in the narrowband region, the signal based at least in part on a first sampling rate that is less than a second sampling rate associated with the system bandwidth as described with reference to FIGS. 2-5. In some examples, the operations of block 1605 may be performed by the signaling module 715 as described with reference to FIG. 7.

At block 1610, the UE 115 or base station 105 may identify a first set of samples of the signal at the first sampling rate, where at least one sample of the first set of samples corresponds to a first CP associated with the first sampling rate as described with reference to FIGS. 2-5. In some cases, the first set of samples corresponds to a first symbol period of a subframe. In some examples, the operations of block 1610 may be performed by the sample identification module 820 as described with reference to FIG. 8.

At block 1615, the UE 115 or base station 105 may extract information from a subset of the first set of samples, where the subset excludes the at least one sample that corresponds to the first CP as described with reference to FIGS. 2-5. In some examples, the operations of block 1615 may be performed by the extraction module 825 as described with reference to FIG. 8.

At block 1620, the UE 115 or base station 105 may identify a second set of samples of the signal at the first sampling rate, where at least one sample of the second set of samples corresponds to a second CP associated with the first sampling rate as described with reference to FIGS. 2-5. In some examples, the second set of samples corresponds to a second symbol period of the subframe following the first symbol period. In some examples, the operations of block 1620 may be performed by the sample identification module 820 as described with reference to FIG. 8.

At block 1625, the UE 115 or base station 105 may identify a third set of samples of the signal at the first sampling rate, where at least one sample of the third set of samples corresponds to the first CP as described with reference to FIGS. 2-5. In some cases, the third set of samples corresponds to a third symbol period of the subframe following the second symbol period. In some examples, the operations of block 1625 may be performed by the sample identification module 820 as described with reference to FIG. 8.

Thus, methods 1100, 1200, 1300, 1400, 1500, and 1600 may provide for narrowband operation with reduced sampling rate. In some examples, aspects from two or more of the methods 1100, 1200, 1300, 1400, 1500, and 1600, described with reference to FIGS. 11, 12, 13, 14, 15, and 16 may be combined. It should be noted that methods 1100, 1200, 1300, 1400, 1500, and 1600 describe possible implementation, and that the operations and the steps may be rearranged or otherwise modified such that other implementations are possible.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases 0 and A are commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM). An orthogonal frequency division multiple access (OFDMA) system may implement a radio technology such as Ultra Mobile Broadband (UMB), Evolved UTRA (E-UTRA), IEEE 802.11 (Wi-Fi), IEEE 802.16 (WiMAX), IEEE 802.20, Flash-OFDM, etc. UTRA and E-UTRA are part of Universal Mobile Telecommunications system (UMTS). 3GPP LTE and LTE-A are new releases of Universal Mobile Telecommunications System (UMTS) that use E-UTRA. UTRA, E-UTRA, UMTS, LTE, LTE-A, and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. The description herein, however, describes an LTE system for purposes of example, and LTE terminology is used in much of the description above, although the techniques are applicable beyond LTE applications.

In LTE/LTE-A networks, including in such networks described herein, the term evolved node B (eNB) may be generally used to describe the base stations. The wireless communications system or systems described herein may include a heterogeneous LTE/LTE-A network in which different types of eNBs provide coverage for various geographical regions. For example, each eNB or base station may provide communication coverage for a macro cell, a small cell, or other types of cell. The term "cell" is a 3GPP term that can be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNB, Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers). A UE may be able to communicate with various types of base stations and network equipment including macro eNBs, small cell eNBs, relay base stations, and the like.

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 and 200 of FIGS. 1 and 2—may include one or more carriers, where each carrier may be a signal made up of multiple sub-carriers (e.g., waveform signals of different frequencies). Each modulated signal may be sent on a different sub-carrier and may carry control information (e.g., reference signals, control channels, etc.), overhead information, user data, etc. The communication links described herein (e.g., communication links 125 of FIG. 1) may transmit bidirectional communications using frequency division duplex (FDD) (e.g., using paired spectrum resources) or time division duplex (TDD) operation (e.g., using unpaired spectrum resources). Frame structures may be defined for FDD (e.g., frame structure type 1) and TDD (e.g., frame structure type 2).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in diagram or block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method of wireless communication in a system that supports operation in a narrowband region of a system bandwidth, comprising:

generating a sequence based at least in part on a first sampling rate associated with the narrowband region of the system bandwidth that is less than a second sampling rate associated with the system bandwidth, wherein the narrowband region comprises a bandwidth less than the system bandwidth;

generating a first cyclic prefix and a second cyclic prefix, wherein the first cyclic prefix and the second cyclic prefix are associated with the first sampling rate, and wherein the first cyclic prefix has a first duration and the second cyclic prefix has a second duration that is shorter than the first duration; and transmitting a signal comprising the sequence in the narrowband region, wherein the signal comprises one or more symbol periods with the first cyclic prefix and one or more symbol periods with the second cyclic prefix based at least in part on a cyclic prefix sequence comprising at least one of the first cyclic prefix and at least one of the second cyclic prefix.

2. The method of claim 1, further comprising:
generating a third cyclic prefix associated with the first sampling rate, wherein the third cyclic prefix has a third duration that is shorter than the first duration,
wherein the signal comprises the first symbol period with the first cyclic prefix, the second symbol period with the second cyclic prefix, and a third symbol period with the third cyclic prefix.

3. The method of claim 2, wherein the first symbol period aligns with a symbol period associated with the system bandwidth, and wherein a first pair comprising the second and third symbol periods aligns with a second pair of symbol periods associated with the system bandwidth.

4. The method of claim 1, further comprising:
converting symbols of the sequence associated with the first sampling rate to a third sampling rate that is greater than the first sampling rate and less than the second sampling rate.

5. The method of claim 4, further comprising:
generating filler samples at the third sampling rate, wherein the signal comprises symbols having at least one filler sample.

6. The method of claim 5, wherein symbol periods associated with the narrowband region align with symbol periods associated with the system bandwidth.

7. The method of claim 1, wherein generating the sequence comprises:
performing an inverse fast Fourier transform based at least in part on the first sampling rate.

8. The method of claim 1, wherein generating the sequence comprises:
performing a digital-to-analog conversion based at least in part on the first sampling rate.

9. The method of claim 1, further comprising:
applying, to the sequence, a low latency transmission filter based at least in part on a spectral mask.

10. The method of claim 1, further comprising:
appending a postfix to the sequence, wherein the signal comprises a first symbol window and a second symbol window, the first symbol window comprising the sequence, the first cyclic prefix, and the postfix,
wherein the postfix of the first symbol window overlaps a second cyclic prefix of the second symbol window.

11. The method of claim 1, wherein the signal comprises symbol periods of a timing configuration associated with the narrowband region, and wherein subframes of the timing configuration associated with the narrowband region align with subframes of a timing configuration associated with the system bandwidth.

12. A method of wireless communication in a system that supports operation in a narrowband region of a system bandwidth, comprising:
receiving a signal in the narrowband region, wherein the signal comprises one or more symbol periods with a first cyclic prefix and one or more symbol periods with a second cyclic prefix based at least in part on a cyclic prefix sequence comprising at least one of the first cyclic prefix and at least one of the second cyclic prefix, and wherein the signal is based at least in part on a first sampling rate that is less than a second sampling rate associated with the system bandwidth, wherein the narrowband region comprises a bandwidth less than the system bandwidth;

identifying a first set of samples and a second set of samples of the signal at the first sampling rate, wherein at least one sample of the first set of samples corresponds to the first cyclic prefix associated with the first sampling rate, and wherein at least one sample of the second set of samples corresponds to the second cyclic prefix associated with the first sampling rate; and extracting information from a subset of the first set of samples, wherein the subset excludes the at least one sample that corresponds to the first cyclic prefix.

13. The method of claim 12, further comprising:
identifying a third set of samples of the signal at the first sampling rate, wherein at least one sample of the third set of samples corresponds to the first cyclic prefix,
wherein the first set of samples corresponds to a first symbol period of a subframe, the second set of samples corresponds to a second symbol period of the subframe following the first symbol period, and the third set of samples corresponds to a third symbol period of the subframe following the second symbol period.

14. The method of claim 13, wherein a first pair comprising the second and third symbol periods aligns with a second pair of symbol periods associated with the system bandwidth.

15. The method of claim 12, further comprising:
processing the subset of the first set of samples at a third sampling rate that is less than the first sampling rate.

16. The method of claim 15, wherein the first set of samples comprises a filler sample associated with the third sampling rate, and the subset of the first set of samples excludes the filler sample.

17. The method of claim 16, wherein symbol periods associated with the narrowband region align with symbol periods associated with the system bandwidth.

18. The method of claim 12, wherein the first set of samples corresponds to a symbol period of a timing configuration associated with the narrowband region, and wherein subframes of the timing configuration associated with the narrowband region align with subframes of a timing configuration associated with the system bandwidth.

19. An apparatus for wireless communication in a system that supports operation in a narrowband region of a system bandwidth, comprising:
a processor;
memory in communication with the processor; and
instructions stored in the memory, the instructions being executable by the processor to:
generate a sequence based at least in part on a first sampling rate associated with the narrowband region that is less than a second sampling rate associated with the system bandwidth, wherein the narrowband region comprises a bandwidth less than the system bandwidth;
generate a first cyclic prefix and a second cyclic prefix, wherein the first cyclic prefix and the second cyclic prefix are associated with the first sampling rate, and wherein the first cyclic prefix has a first duration and the second cyclic prefix has a second duration that is shorter than the first duration; and
transmit a signal comprising the sequence in the narrowband region, wherein the signal comprises one or more symbol periods with the first cyclic prefix and one or more symbols with the second cyclic prefix based at least in part on a cyclic prefix sequence comprising at least one of the first cyclic prefix and at least one of the second cyclic prefix.

20. The apparatus of claim 19, wherein the instructions are executable by the processor to:
generate third cyclic prefix associated with the first sampling rate, wherein the third cyclic prefix has a third duration that is shorter than the first duration,
wherein the signal comprises the first symbol period with the first cyclic prefix, the second symbol period with the second cyclic prefix, and a third symbol period with the third cyclic prefix.

21. The apparatus of claim 19, wherein the instructions are executable by the processor to:
convert symbols of the sequence associated with the first sampling rate to a third sampling rate that is greater than the first sampling rate and less than the second sampling rate.

22. The apparatus of claim 19, wherein the instructions are executable by the processor to:
perform an inverse fast Fourier transform based at least in part on the first sampling rate.

23. The apparatus of claim 19, wherein the instructions are executable by the processor to:
perform a digital-to-analog conversion based at least in part on the first sampling rate.

24. The apparatus of claim 19, wherein the instructions are executable by the processor to:
apply, to the sequence, a low latency transmission filter based at least in part on a spectral mask.

25. The apparatus of claim 19, wherein the instructions are executable by the processor to:
append a postfix to the sequence, wherein the signal comprises a first symbol window and a second symbol window, the first symbol window comprising the sequence, the first cyclic prefix, and the postfix,
wherein the postfix of the first symbol window overlaps a second cyclic prefix of the second symbol window.

26. The apparatus of claim 19, wherein the signal comprises symbol periods of a timing configuration associated with the narrowband region, and wherein subframes of the timing configuration associated with the narrowband region align with subframes of a timing configuration associated with the system bandwidth.

27. An apparatus for wireless communication in a system that supports operation in a narrowband region of a system bandwidth, comprising:
a processor;
memory in communication with the processor; and
instructions stored in the memory, the instructions being executable by the processor to:
receive a signal in the narrowband region, wherein the signal comprises one or more symbol periods with first cyclic prefix and one or more symbol periods with a second cyclic prefix based at least in part on a cyclic prefix sequence comprising at least one of the first cyclic prefix and at least one of the second cyclic prefix, and wherein the signal is based at least in part on a first sampling rate that is less than a second sampling rate associated with the system bandwidth, wherein the narrowband region comprises a bandwidth less than the system bandwidth;
identify a first set of samples and a second set of samples of the signal at the first sampling rate, wherein at least one sample of the first set of samples corresponds to the first cyclic prefix associated with the first sampling rate, and wherein at least one sample of the second set of samples corresponds to the second cyclic prefix associated with the first sampling rate; and
extract information from a subset of the first set of samples, wherein the subset excludes the at least one sample that corresponds to the first cyclic prefix.

28. The apparatus of claim 27, wherein
the instructions are executable by the processor to:
identify a third set of samples of the signal at the first sampling rate, wherein at least one sample of the third set of samples corresponds to the first cyclic prefix,
wherein the first set of samples corresponds to a first symbol period of a subframe, the second set of samples corresponds to a second symbol period of the subframe following the first symbol period, and the third set of samples corresponds to a third symbol period of the subframe following the second symbol period.

29. The apparatus of claim 27, wherein the instructions are executable by the processor to:
process the subset of the first set of samples at a third sampling rate that is less than the first sampling rate.

30. The apparatus of claim 27, wherein the first set of samples corresponds to a symbol period of a timing configuration associated with the narrowband region, and wherein subframes of the timing configuration associated with the narrowband region align with subframes of a timing configuration associated with the system bandwidth.

31. The method of claim 1, wherein the one or more symbol periods with the first cyclic prefix alternate with the one or more symbol periods with the second cyclic prefix.

* * * * *